(12) United States Patent
Dorner

(10) Patent No.: US 10,637,486 B2
(45) Date of Patent: Apr. 28, 2020

(54) OSCILLATING CIRCUITRY

(71) Applicant: SOCIONEXT INC., Yokohama-shi, Kanagawa (JP)

(72) Inventor: Albert Hubert Dorner, Lahr (DE)

(73) Assignee: SOCIONEXT, INC., Yokohama (JP)

( * ) Notice: Subject to any disclaimer, the term of this patent is extended or adjusted under 35 U.S.C. 154(b) by 35 days.

(21) Appl. No.: 16/012,090

(22) Filed: Jun. 19, 2018

(65) Prior Publication Data
US 2019/0036537 A1   Jan. 31, 2019

(30) Foreign Application Priority Data

Jul. 25, 2017  (EP) .................................. 17183133

(51) Int. Cl.
*H03L 7/10* (2006.01)
*H03L 1/02* (2006.01)
*H03L 7/091* (2006.01)
*H03L 7/099* (2006.01)

(52) U.S. Cl.
CPC .............. *H03L 7/102* (2013.01); *H03L 1/022* (2013.01); *H03L 1/026* (2013.01); *H03L 7/091* (2013.01); *H03L 7/099* (2013.01); *H03L 2207/06* (2013.01); *H03L 2207/50* (2013.01)

(58) Field of Classification Search
CPC ...................................................... H03L 7/102
USPC ......................................................... 331/1 R
See application file for complete search history.

(56) References Cited

U.S. PATENT DOCUMENTS

| 2011/0316595 | A1 | 12/2011 | Bolton |
| 2012/0249249 | A1 | 10/2012 | Shen |
| 2014/0347137 | A1 | 11/2014 | Rey et al. |
| 2017/0012631 | A1 | 1/2017 | Dato et al. |
| 2017/0126237 | A1* | 5/2017 | Pavao Moreira ..... H03L 7/0991 |
| 2017/0264302 | A1* | 9/2017 | Arora ...................... H03L 7/099 |

OTHER PUBLICATIONS

Extended European Search Report, European Patent Application No. 17183133.3, dated Feb. 13, 2018.
Wu, Wanghua, et al., A mm-Wave FMCW Radar Transmitter Based on a Multirate ADPLL, 2013 IEEE Radio Frequency Integrated Circuits Symposium, pp. 107-110 (2013).

* cited by examiner

*Primary Examiner* — Joseph Chang
(74) *Attorney, Agent, or Firm* — Arent Fox, LLP

(57) ABSTRACT

The present disclosure relates to oscillating circuitry, comprising a controllable oscillator operable to generate an output signal having an output frequency dependent on a coarse value and a fine value, the coarse value causing the output frequency to be within an associated band of output frequencies and the fine value controlling the output frequency within that band; and control circuitry operable to generate the coarse and fine values so as to control the controllable oscillator. In certain arrangements, the control circuitry compensates for temperature fluctuations during operation.

17 Claims, 15 Drawing Sheets

| A | B | C | D | E | F |
|---|---|---|---|---|---|
| COARSE VALUE DISTANCE | COARSE VALUE CHANGE | MEASURED FINE CHANGE | CORRECTED FINE CHANGE | UPDATED FINE CHANGE | DEFAULT FINE CHANGE |
| 0 | 85/86 | 1000 | 1000 (+0%) | 1002 | 1000 |
| +5 | 90/91 | 600 | 612 (+2%) | 616 | 580 |
| +10 | 95/96 | 1200 | 1236 (+3%) | 1230 | 1100 |
| +15 | 100/101 | 900 | 954 (+6%) | 962 | 850 |
| +20 | 105/106 | 800 | 864 (+8%) | 852 | 750 |

FIG. 5

OSCILLATING CIRCUITRY

CROSS-REFERENCE TO RELATED APPLICATIONS

This application claims priority from European Patent Application No. 17183133.2 filed Jul. 25, 2017. The entire contents of this application is incorporated herein by reference.

The present invention relates to oscillating circuitry, and in particular oscillating circuitry which is operable to generate an output signal having a controlled output frequency. The present invention also relates to corresponding methods and computer programs for use in controlling such circuitry.

Oscillating circuitry may for example be operable to generate the output signal based on a reference signal, for example under control loop operation. The circuitry may for example comprise the structure and/or function of a negative feedback loop. Example circuitry includes a phase-locked loop or phase lock loop (PLL), which effectively is a control system that generates the output signal with its phase related to the phase of an input reference signal.

Such oscillating circuitry typically has a controllable oscillator, such as a voltage-controlled oscillator (VCO), which generates a periodic signal. In the case of a PLL, a phase detector compares the phase of that periodic signal with the phase of the input periodic reference signal, and the oscillator is controlled to keep the phases in a defined relationship. The periodic signals may be clock signals.

The controllable oscillator may be configured such that its output signal has an output frequency dependent on a coarse value and a fine value, the coarse value causing the output frequency to be within an associated band of output frequencies and the fine value controlling the output frequency within that band. Thus, the controllable oscillator may be controlled by supplying it with suitable coarse and fine values, for example by applying control-loop adjustments to the coarse and fine values to tend to maintain the output frequency at a target frequency.

It has been found that previously-considered oscillating circuitry has noise performance issues, for example jitter (phase errors) in the output signal. Such noise performance issues have been found to be exacerbated when operating the circuitry over a relatively wide temperature range.

It is desirable to address some or all of the above problems.

According to an embodiment of a first aspect of the present invention, there is provided oscillating circuitry, comprising: a controllable oscillator operable to generate an output signal having an output frequency dependent on a coarse value and a fine value, the coarse value causing the output frequency to be within an associated band of output frequencies and the fine value controlling the output frequency within that band; and control circuitry operable to generate the coarse and fine values so as to control the controllable oscillator, wherein the control circuitry is operable: under control loop operation, based on a measurement indicative of a difference between the output frequency and a target frequency, to apply control-loop adjustments to the coarse and fine values to tend to maintain the output frequency at the target frequency; in a calibration mode at a calibration temperature, to measure a fine value change which would occur under the control loop operation when an associated coarse value change, corresponding at the calibration temperature to a target frequency which is different from an operational target frequency, is caused to occur by adjusting the target frequency; in a temperature-correction mode, to correct the measured fine value change to account for a temperature different from the calibration temperature at which its associated coarse value change would be expected to occur under the control loop operation with the operational target frequency; and in an operational mode, under the control loop operation with the operational target frequency, to impose the corrected fine value change on the fine value when its associated coarse value change is caused to occur (and e.g. then continue with any further control-loop adjustments).

Advantageously, by imposing the corrected fine value change on the fine value when its associated coarse value change is caused to occur, the control loop operation is assisted in quickly finding the correct fine value after the coarse value change for the output frequency to match the operational target frequency as close as possible. The coarse value change may have occurred due to a change in temperature, and the correction performed in the temperature-correction mode leads to the corrected fine value change closely matching the performance of the controllable oscillator at the changed temperature. Thus, noise/distortion in the output signal (which may otherwise be suffered when the temperature changes) is reduced or avoided.

The oscillating circuitry may be integrated circuitry, for example implemented as an IC chip or part thereof.

The controllable oscillator may be configured such that each coarse value within a range of coarse values causes the output frequency to be within its own associated band of output frequencies. For example, the controllable oscillator may be configured such that the larger the coarse value the higher its associated band of output frequencies. The opposite may be the case instead.

The controllable oscillator may be configured such that the position of the fine value within a range of fine values corresponds to the position of the output frequency within the band of frequencies concerned. For example, the controllable oscillator may be configured such that the larger the fine value the higher the output frequency within the band of frequencies concerned. The opposite may be the case instead.

The controllable oscillator may be configured such that: the bands of output frequencies partially overlap; and/or the bands of output frequencies collectively cover an operational range of output frequencies of the oscillating circuitry. Thus, it may be possible to achieve the same output frequency by operating in different bands (i.e. with different coarse and fine value combinations).

The control circuitry may be configured to change the coarse value when the fine value reaches an upper or lower limit value. For example, the control circuitry may be configured to increase the coarse value when the fine value reaches the upper limit value and to decrease the coarse value when the fine value reaches the lower limit value. The opposite may be the case instead.

The upper and lower limit values may be the extreme ends of the range of available fine values or may be set slightly within the extreme ends, to avoid needing to use the full range of values (e.g. in case the operation may be non-linear towards the extreme ends).

The measurement indicative of a difference between the output frequency and a target frequency may be a phase-difference, frequency or timing measurement, optionally between the output signal and a reference signal (having a reference frequency) or between the output signal and a target signal (having the target frequency). The reference and target signals may be digital signals, e.g. with values representing phase.

The control circuitry may be operable: in the calibration mode at the calibration temperature, to cause a plurality of coarse value changes to occur by adjusting the target frequency, each coarse value change corresponding at the calibration temperature to a target frequency which is different from the operational target frequency, and to measure, for each of those coarse value changes, an associated fine value change; in the temperature-correction mode, to correct each or any of the measured fine value changes to account for a temperature different from the calibration temperature at which its associated coarse value change would be expected to occur under the control loop operation with the operational target frequency; and in the operational mode, when one of the coarse value changes is caused to occur, to impose its associated corrected fine value change on the fine value and then continue with any further control-loop adjustments.

Thus, a plurality of coarse value changes may be catered for, to cover an operational temperature range (e.g. a design requirement) of the oscillating circuitry.

The controllable oscillator may be configured so that, at the calibration temperature, the coarse value for the operational target frequency is positioned within an operational range of coarse values (proportionally) relative to the position of the calibration temperature within an operational temperature range of the oscillating circuitry. For example, the plurality of coarse value changes may comprise each of the coarse value changes in the operational range of coarse values to cover the operational temperature range of the oscillating circuitry.

The control circuitry may be operable, in the calibration mode at the calibration temperature, to measure the or each associated fine value change by adjusting the target frequency under the control loop operation and measuring the fine value change which does occur when the associated coarse value change is caused to occur. As another possibility, the control circuitry may be operable, in the calibration mode at the calibration temperature, to measure the or each associated fine value change by adjusting the coarse value and adjusting the fine value to maintain the output frequency (i.e. without needing to be under the control loop operation).

The control circuitry may be operable to enter the temperature-correction mode while in the operational mode so as to perform the correction of any or each said measured fine value change if it is determined that the associated coarse value change will occur. This may be equivalent to obtaining the or each corrected fine value change on a just-in-time basis, such that if a particular corrected fine value change is not needed it is not generated.

The control circuitry may be operable to enter the temperature-correction mode before entering the operational mode so as to perform the correction of any or each said measured fine value change before the operational mode is entered. Thus, it may be possible to generate all corrected fine value changes that may ever be needed in one use of the temperature-correction mode. This may be useful if the functionality of the temperature-correction mode is to be detached after an initial setup phase of the oscillating circuitry.

Each coarse value change which is caused to occur in the calibration mode at the calibration temperature may be caused to occur by progressively adjusting the target frequency. That is, the target frequency may be swept up or down to cause each coarse value change. The target frequency may be swept up and down through the operational range of frequencies to cause all of the coarse value changes needed in the calibration phase to occur.

The control circuitry may be operable, in the calibration mode at the calibration temperature, to adjust the target frequency from the operational target frequency. For example, the target frequency may be swept up and down through the operational range of frequencies starting at the operational target frequency. Adjusting the target frequency from the operational target frequency in the calibration mode may be considered detuning the target frequency from the operational target frequency.

The control circuitry may be operable, in the operational mode, when a coarse value change occurs and after imposing the associated corrected fine value change on the fine value, to determine whether any further control-loop adjustments are made associated with that coarse value change before the fine value settles and, if so, to update the associated corrected fine value change to account for such further control-loop adjustments. Thus, the oscillating circuitry may be configured to learn which fine value changes represent its actual response to temperature change.

The control circuitry may be operable, when updating a corrected fine value change, to take account of previous updates to that corrected fine value change. That is, a history of updates may be taken into account, to avoid e.g. one spurious update having too large an effect. For example, the control circuitry may be operable, when updating a corrected fine value change, to apply a moving average process to take account of previous updates to that corrected fine value change. This may provide a low-pass filtering of updated values, to reject high-frequency noise in those values.

The or each temperature may be a temperature of the controllable oscillator or of the oscillating circuitry, or for example an ambient temperature taken to be the temperature of the controllable oscillator or of the oscillating circuitry. The oscillating circuitry accordingly may comprise a temperature sensor operable to measure the calibration temperature.

The control circuitry may be operable, under the control loop operation, to apply the control-loop adjustments such that the output frequency tends to settle at the target frequency concerned. Control parameters of the control loop operation may affect how quickly the output frequency tends to settle when disturbed, or when the coarse and/or fine values are changed.

The control circuitry may comprise a control loop (e.g. an analogue control loop) operable to carry out the control loop operation. As another option, the control loop operation may be implemented in digital circuitry, for example in software running on a processor. The control circuitry may comprise PI-loop filter circuitry (including a software implementation) configured to generate the fine value, the PI-loop filter circuitry having a P-path being a proportional-gain path and an I-path being an integral-gain path. The control circuitry may be operable, in the operational mode, when one of the coarse value changes is caused to occur, to impose its associated corrected fine value change on the fine value by applying that corrected fine value change (e.g. as an addition or subtraction) to the I-path of the PI-loop filter circuitry. This may be considered an elegant way to implement the fine value changes.

The control circuitry may be operable, in the calibration mode at the calibration temperature, when a said coarse value change is caused to occur, to impose an associated default fine value change on the fine value and then continue with any further control-loop adjustments before measuring the associated fine value change. The use of such default values may enable the control loop operation to settle more quickly. The control circuitry may be operable, in the calibration mode at the calibration temperature, when a said coarse value change is caused to occur, to measure the associated fine value change after the fine value has settled for the corresponding target output frequency.

The control circuitry may be operable to impose/force a said fine value change by overriding or temporarily interrupting the control loop operation, or by interjecting the fine value change (i.e. step changing, or suddenly changing, or immediately changing the fine value).

The control circuitry may comprise a memory and may be operable to record or store the fine value changes in the memory. Such a memory may be a register, or any other form of memory capable of storing and reading out the fine value changes. Such memory may be external to the oscillating circuitry, and for example accessible by the control circuitry.

The control circuitry may be operable, in the temperature-correction mode, to determine an amount by which to correct a said fine value change by reference to temperature-dependence information indicating how the operation of the oscillating circuitry or the controllable oscillator changes with temperature.

For example, the control circuitry may be operable: in the calibration mode at a calibration temperature, to measure for the or each said coarse value change an associated frequency change by which the output frequency would change if the fine value is not changed as the coarse value changes; and in the temperature-correction mode, to determine an amount by which to correct a said fine value change by reference to the or each associated frequency change (e.g. its frequency distance from a reference frequency such as the operational target frequency) and temperature-dependence information indicating how that associated frequency change changes (both in its frequency size and its frequency distance from the reference frequency) with temperature.

The temperature-dependence information may be representative of the operation of the oscillating circuitry with changing temperature, for example having been measured based on various real samples of the oscillating circuitry. In this way, the corrected fine value changes may closely represent the actual operation of the oscillating circuitry with changing temperature, leading to low noise performance even with changing temperature.

The control circuitry may be operable, in the calibration mode at the calibration temperature, to measure the or each associated frequency change for example by: adjusting the target frequency under the control loop operation and measuring the target or output frequency when the fine value is the same with the two different coarse values of the coarse value change; or for example holding the fine value constant when the coarse value change occurs and measuring the change in output frequency.

The control circuitry may comprise a memory in which the temperature-dependence information is stored. Such a memory may be a register, or any other form of memory capable of storing and reading out the temperature-dependence information. Such memory may be external to the oscillating circuitry, and for example accessible by the control circuitry.

The output signal may be a clock signal, for example a switched logic-level (e.g. digital) clock signal or a sinusoidal (e.g. analogue) clock signal. The reference and target signals may also be clock signals. The output, reference and target signals may also be other types of periodic signal.

The oscillating circuitry may be considered a phase-locked loop. The oscillating circuitry may be or comprise integrated circuitry, such as an IC chip.

According to an embodiment of a second aspect of the present invention, there is provided integrated circuitry, such as an IC chip, comprising oscillating circuitry according to the aforementioned first aspect.

According to an embodiment of a third aspect of the present invention, there is provided a method of controlling oscillating circuitry, the oscillating circuitry comprising a controllable oscillator operable to generate an output signal having an output frequency dependent on a coarse value and a fine value, the coarse value causing the output frequency to be within an associated band of output frequencies and the fine value controlling the output frequency within that band, the method comprising: generating the coarse and fine values so as to control the controllable oscillator; under control loop operation, based on a measurement indicative of a difference between the output frequency and a target frequency, applying control-loop adjustments to the coarse and fine values to tend to maintain the output frequency at the target frequency; in a calibration mode at a calibration temperature, measuring a fine value change which would occur under the control loop operation when an associated coarse value change, corresponding at the calibration temperature to a target frequency which is different from an operational target frequency, is caused to occur by adjusting the target frequency; in a temperature-correction mode, correcting the measured fine value change to account for a temperature different from the calibration temperature at which its associated coarse value change would be expected to occur under the control loop operation with the operational target frequency; and in an operational mode, under the control loop operation with the operational target frequency, imposing the corrected fine value change on the fine value when its associated coarse value change is caused to occur (and e.g. then continue with any further control-loop adjustments).

According to an embodiment of a fourth aspect of the present invention, there is provided a computer program which, when executed on a computer of oscillating circuitry, causes the computer to carry out a method of controlling the oscillating circuitry, the oscillating circuitry comprising a controllable oscillator operable to generate an output signal having an output frequency dependent on a coarse value and a fine value, the coarse value causing the output frequency to be within an associated band of output frequencies and the fine value controlling the output frequency within that band, the method comprising: generating the coarse and fine values so as to control the controllable oscillator; under control loop operation, based on a measurement indicative of a difference between the output frequency and a target frequency, applying control-loop adjustments to the coarse and fine values to tend to maintain the output frequency at the target frequency; in a calibration mode at a calibration temperature, measuring a fine value change which would occur under the control loop operation when an associated coarse value change, corresponding at the calibration temperature to a target frequency which is different from an operational target frequency, is caused to occur by adjusting the target frequency; in a temperature-correction mode, correcting the measured fine value change to account for a temperature different from the calibration temperature at which its associated coarse value change would be expected to occur under the control loop operation with the operational target frequency; and in an operational mode, under the control loop operation with the operational target frequency, imposing the corrected fine value change on the fine value when its associated coarse value change is caused to occur (and e.g. then continue with any further control-loop adjustments).

According to an embodiment of a fifth aspect of the present invention, there is provided oscillating circuitry, comprising: a controllable oscillator operable to generate an output signal having an output frequency dependent on a coarse value and a fine value, the coarse value causing the output frequency to be within an associated band of output frequencies and the fine value controlling the output frequency within that band; and control circuitry operable to generate the coarse and fine values so as to control the controllable oscillator, wherein the control circuitry is operable: under control loop operation, based on a measurement indicative of a difference between the output frequency and a target frequency, to apply control-loop adjustments to the coarse and fine values to tend to maintain the output frequency at the target frequency; and in an operational mode, under the control loop operation with an operational target frequency, to impose a corrected fine value change on the fine value when an associated coarse value change is caused to occur (and e.g. then continue with any further control-loop adjustments), the corrected fine value change having been corrected from an uncorrected fine value change to take account of a temperature change expected to cause that coarse value change.

According to an embodiment of a sixth aspect of the present invention, there is provided a system (such as a modular system) comprising oscillating circuitry and configuration circuitry, wherein: the oscillating circuitry and configuration circuitry are separable from one another; the oscillating circuitry comprises a controllable oscillator operable to generate an output signal having an output frequency dependent on a coarse value and a fine value, the coarse value causing the output frequency to be within an associated band of output frequencies and the fine value controlling the output frequency within that band, and control circuitry operable to generate the coarse and fine values so as to control the controllable oscillator; the control circuitry is operable, under control loop operation, based on a measurement indicative of a difference between the output frequency and a target frequency, to apply control-loop adjustments to the coarse and fine values to tend to maintain the output frequency at the target frequency; the control circuitry and configuration circuitry are operable, in a calibration mode at a calibration temperature, to measure a fine value change which would occur under the control loop operation when an associated coarse value change, corresponding at the calibration temperature to a target frequency which is different from an operational target frequency, is caused to occur by adjusting the target frequency; the control circuitry and configuration circuitry are operable, in a temperature-correction mode, to correct the measured fine value change to account for a temperature different from the calibration temperature at which its associated coarse value change would be expected to occur under the control loop operation with the operational target frequency, and to store the corrected fine value change in the oscillating circuitry; and the control circuitry is operable, in an operational mode, under the control loop operation with the operational target frequency, to impose the corrected fine value change as stored in the oscillating circuitry on the fine value when its associated coarse value change is caused to occur (and e.g. then continue with any further control-loop adjustments).

The configuration circuitry may only be needed in an initial setup phase for example, and then may be disconnected (with the corrected fine value changes left stored in the control circuitry for example).

Method and computer program aspects corresponding to the aforementioned fifth and sixth aspects are envisaged. Computer-readable storage medium aspects are also envisaged, the medium have such computer programs stored thereon.

Features of the apparatus (circuitry) aspects apply equally to the method, computer program and storage medium aspects, and vice versa.

Reference will now be made, by way of example, to the accompanying drawings, of which:

FIG. 5 is a table of example values useful for understanding operation of the oscillating circuitry of FIG. 1 and its calibration, temperature-correction and operational modes;

The following description presents various arrangements which embody the present invention by way of example.

As an overview, the present disclosure relates to oscillating circuitry, comprising a controllable oscillator operable to generate an output signal having an output frequency dependent on a coarse value and a fine value, the coarse value causing the output frequency to be within an associated band of output frequencies and the fine value controlling the output frequency within that band; and control circuitry operable to generate the coarse and fine values so as to control the controllable oscillator. In certain arrangements, the control circuitry compensates for temperature fluctuations during operation.

Figure 1:
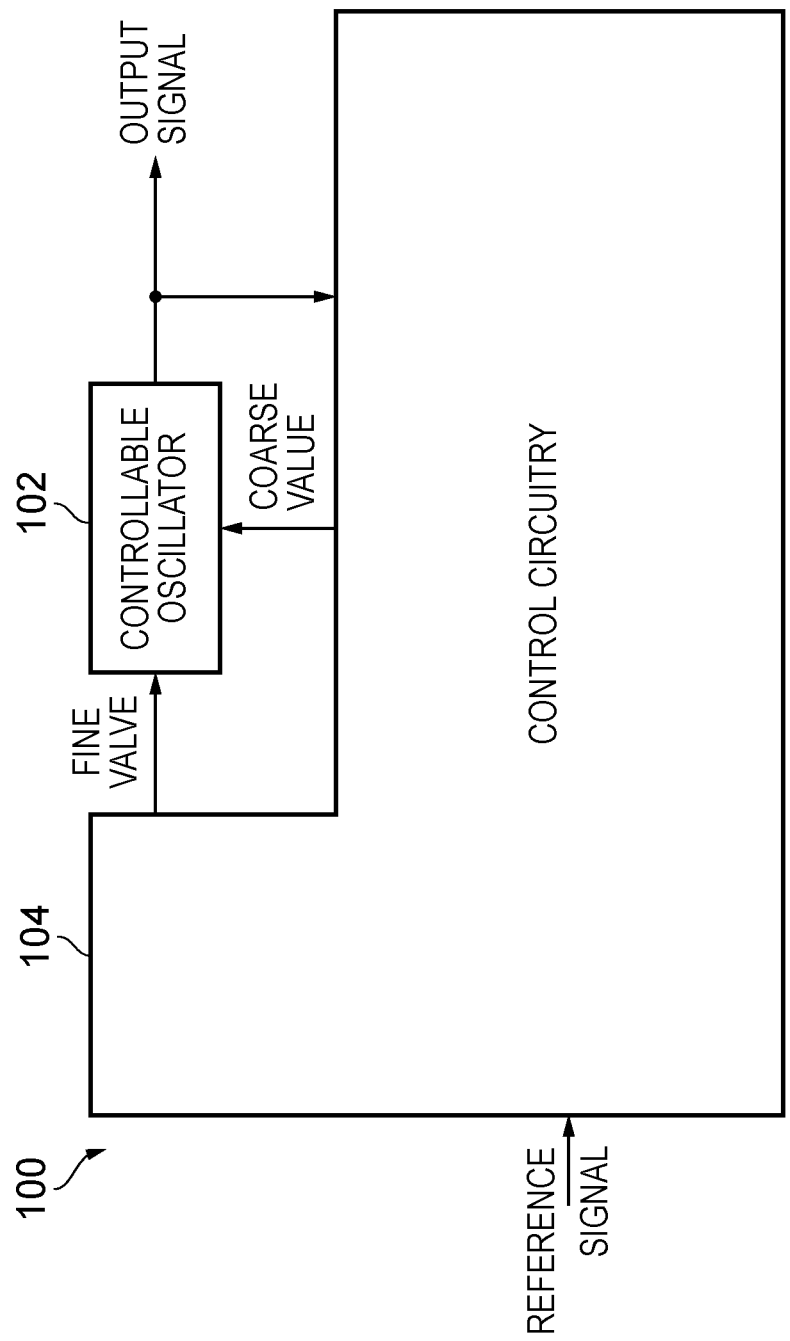
FIG. 1 is a schematic diagram of oscillating circuitry embodying the present invention.

FIG. 1 is a schematic diagram of oscillating circuitry 100. Oscillating circuitry 100 comprises a controllable oscillator 102 and control circuitry 104.

The controllable oscillator 102 is operable to generate an output signal having an output frequency dependent on a coarse value and a fine value. Hence, the controllable oscillator 102 is connected to receive such coarse and fine values. The controllable oscillator 102 is configured such that the coarse value causes the output frequency to be within an associated band of output frequencies and the fine value controls the output frequency within that band. The coarse and fine values may be supplied to the controllable oscillator 102 as for example digital or analogue values.

The control circuitry 104 is operable to generate the coarse and fine values so as to control the controllable oscillator. Thus, the control circuitry 104 is connected to provide the coarse and fine values to the controllable oscillator 102.

The control circuitry is configured to operate under control loop operation, and to operate in one or more of a calibration mode, a temperature-correction mode and an operational mode.

The control circuitry is configured, under control loop operation, based on a measurement indicative of a difference between the output frequency and a target frequency, to apply control-loop adjustments to the coarse and fine values to tend to maintain the output frequency at the target frequency. The measurement indicative of a difference between the output frequency and a target frequency may be a phase-difference measurement, for example between the output signal and a reference signal. The output and reference signals may for example be clock signals. As indicated in FIG. 1, the control circuitry 104 is connected to receive such a reference signal from an external source, however the reference signal could of course be generated within the control circuitry 104 itself (e.g. it may comprise clock generation circuitry) and the present disclosure will be understood accordingly.

Thus, the oscillating circuitry 100 may be considered, under the control loop operation, to operate like a PLL, comparing the output frequency to the target frequency (for example, using the reference signal or a signal based thereon, to generate an error signal) and controlling the controllable oscillator 102 so that the output frequency tends towards or follows the target frequency (typically, to reduce or control the error value expressed by the error signal). The oscillating circuitry 100 may thus be referred to as a PLL.

The calibration, temperature-correction and operational modes relate to improved operation of the oscillating circuitry 100 as follows.

The control circuitry 104 is configured, in a calibration mode at a calibration temperature, to measure a fine value change which would occur under the control loop operation when an associated coarse value change, corresponding at the calibration temperature to a target frequency which is different from an operational target frequency, is caused to occur by adjusting the target frequency.

This will be explained in more detail in connection with FIG. 2, which is a graph useful for understanding operation of the controllable oscillator 102.

Figure 2:
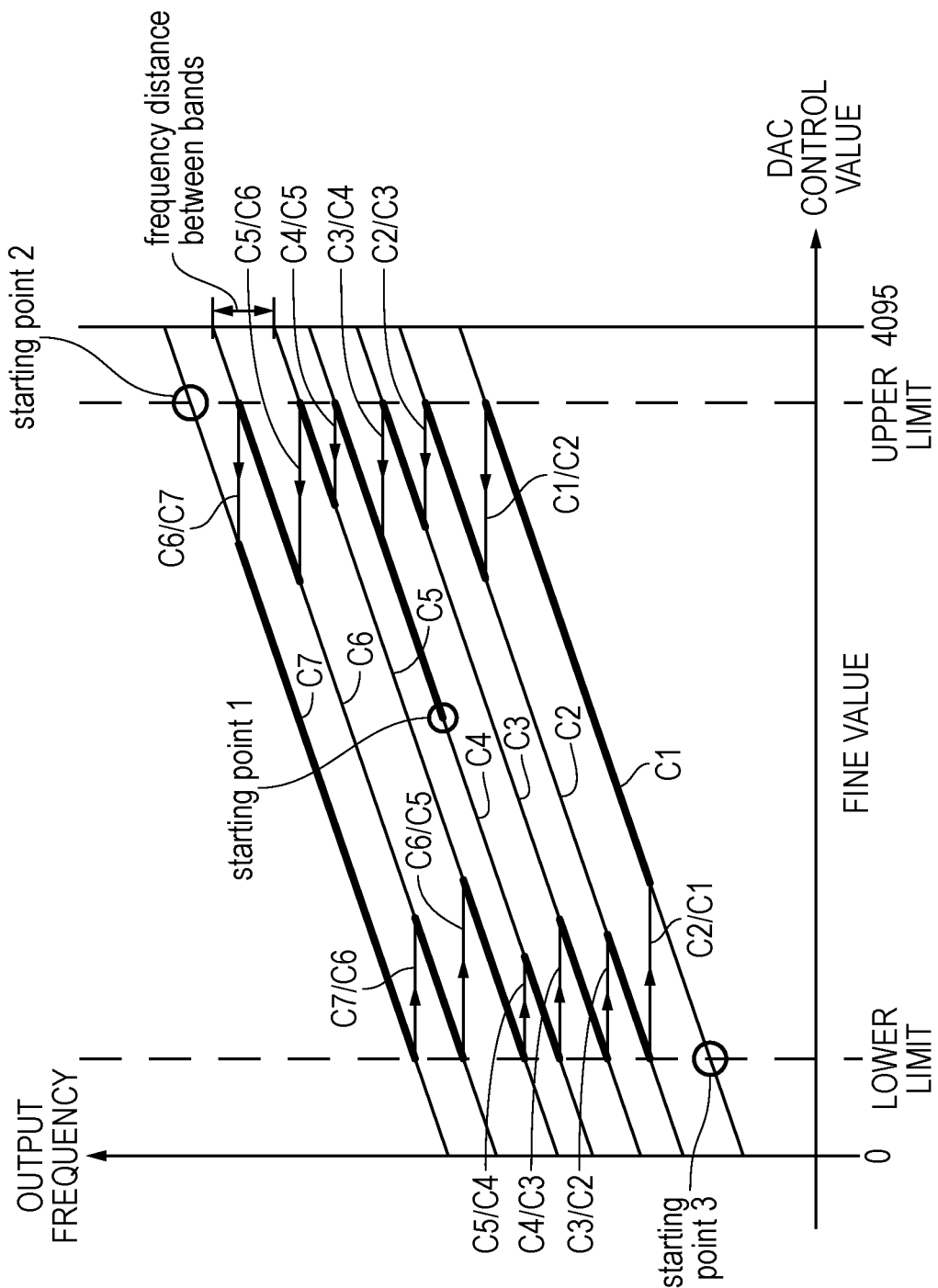
FIG. 2 is schematic diagram for understanding the operation of the controllable oscillator of FIG. 1, and its calibration, temperature-correction and operational modes.

The y-axis of the graph of FIG. 2 represents the output frequency of the output signal and the x-axis represents the fine value input to the controllable oscillator 102. In this example, it assumed that the fine value is generated as an analogue signal based on a digital control value to a DAC (Digital-to-Analogue Converter), so that the DAC control values may be considered as being the corresponding digital fine values. Thus, the x-axis shows control values from 0 to 4095 (4096 different values) assuming an example 12-bit DAC.

Each of the diagonal traces on the graph then represents the how the output frequency varies with fine value for a given band of output frequencies, i.e. for a given coarse value. Thus, each coarse value corresponds to a band of output frequencies. Example coarse values C1 to C7 are provided for ease of explanation. For example, when the coarse value is C1 the output frequency is governed by the fine value as indicated by the lowermost diagonal trace, when the coarse value is C2 the output frequency is governed by the fine value as indicated by the second-to-lowermost diagonal trace, and so on and so forth. Note that the bands of frequencies (i.e. the diagonal lines) are not evenly spaced to show that this may be the case in certain implementations; this is a likely symptom of the functionality of the controllable oscillator 102.

Thus, as will be apparent from FIG. 2, each coarse value within a range of coarse values causes the output frequency to be within its own associated band of output frequencies. In the present example, the larger the coarse value the higher its associated band of output frequencies, however this is of course not essential. Similarly, in the present example, the position of the fine value within a range of fine values corresponds to the position of the output frequency within the band of frequencies concerned. The controllable oscillator 102 is configured such that the larger the fine value the higher the output frequency within the band of frequencies concerned, however this is again not essential.

As will also be apparent from FIG. 2, the bands of output frequencies partially overlap. Indeed, substantial portions of the bands of output frequencies overlap in frequency. It is assumed that the bands of output frequencies collectively cover an operational range of output frequencies of the oscillating circuitry 100. In this respect, there may be many bands of frequencies corresponding respectively to many coarse values. The coarse values C1 to C7 merely constitute a simple example, and in a practical implementation there may be e.g. tens or hundreds of coarse values. For example, the coarse values may be controlled by an 8-bit DAC, allowing for 256 different bands.

As indicated on the x-axis, the fine value may be within a range of fine values (0 to 4095 in FIG. 2), however a smaller range is defined between upper and lower limits. The control circuitry 104 is configured to change the coarse value when the fine value reaches the upper or lower limit value.

Thus, when the coarse value is C1 and the fine value is progressively increased (for example, by increasing the target frequency under control loop operation), the operation of the controllable oscillator 102 (i.e. its output frequency to fine value relationship) tracks up the diagonal line C1 (i.e. for that band) until the fine value reaches the upper limit value. At this point, the coarse value is changed to C2, and if the fine value were not changed too the output frequency would jump up based on the corresponding position on the diagonal line C2 with the same fine value. Instead, under control loop operation, the control circuitry 104 tries to maintain the output frequency at the point where the coarse value change occurs by changing the fine value as indicated by the horizontal line C1/C2 (indicating the fine value change associated with the coarse value change from C1 to C2).

The other fine value changes as indicated on FIG. 2 may be understood accordingly. In the FIG. 2 example, the control circuitry is configured to increase the coarse value when the fine value reaches the upper limit value and to decrease the coarse value when the fine value reaches the lower limit value. For example, the fine value change C3/C4 represents the fine value change associated with the coarse value change from C3 to C4 when the fine value reaches (e.g. by progressively increasing) the upper limit value with the coarse value C3. As another example, the fine value change C7/C6 represents the fine value change associated with the coarse value change from C7 to C6 when the fine value reaches (e.g. by progressively decreasing) the lower limit value with the coarse value C7.

Note that the fine value change C1/C2 may be closely similar to or the same as the fine value change C2/C1, since this change relates to the frequency distance between the frequency band for C1 and the frequency band C2. The same is true for the other pairs of fine value changes that correspond to the same two frequency bands. For example, the fine value change C5/C6 may be closely similar to or the same as the fine value change C6/C5. For each pair, one of the fine value changes (e.g. C3/C4) relates to transitioning upwards in frequency through the bands (i.e. from C3 to C4) and the other fine value change (e.g. C4/C3) relates to transitioning downwards in frequency through the bands (i.e. from C4 to C3). Thus, although for better accuracy it may be helpful to measure all of the fine value changes, i.e. those which relate to transitioning upwards in frequency through the bands as well as those which relate to transitioning downwards in frequency through the bands, it may be acceptable to measure only one of the fine value changes per pair and assume that the other fine value change of the pair is the same. The present disclosure will be understood accordingly.

Incidentally, by measuring the amount that the output frequency jumps (the output frequency change) when the coarse value changes if the fine value is held the same, then the frequency distance between the bands may be measured. One such distance is indicated in FIG. 2. This information is useful in respect of the temperature-correction mode, as will be explained later.

Against this backdrop, the control circuitry 104 is configured, in the calibration mode at the calibration temperature, to cause a plurality of coarse value changes to occur by adjusting the target frequency, each coarse value change corresponding at the calibration temperature to a target frequency which is different from the operational target frequency, and to measure, for each of those coarse value changes, an associated fine value change. Such fine value changes may be measured effectively once the fine value has settled for the corresponding target output frequency (the speed of settling depending on control parameters of the control loop operation).

This may be carried out by adjusting the target frequency under the control loop operation and measuring the fine value change which does occur when the associated coarse value change is caused to occur. For example, the control circuitry 104 may be configured to begin the calibration mode at the example starting point 1 in FIG. 2 (which may represent an operational target frequency—and thus also the output frequency—of the oscillating circuitry 100) and progressively adjust the target frequency up to the top of an operational range, then down to the bottom of the operational range, and back up again to cover the relevant coarse value changes.

This would involve the operation of the controllable oscillator 102 tracking along portions of the diagonal lines C1 to C7 and along all of the fine value changes in a loop as indicated in bold in FIG. 2. The control loop operation (based on the control loop parameters) would have the effect of making the fine value changes as indicated along the way, and these could be measured and for example recorded in memory (not shown).

Figure 3:
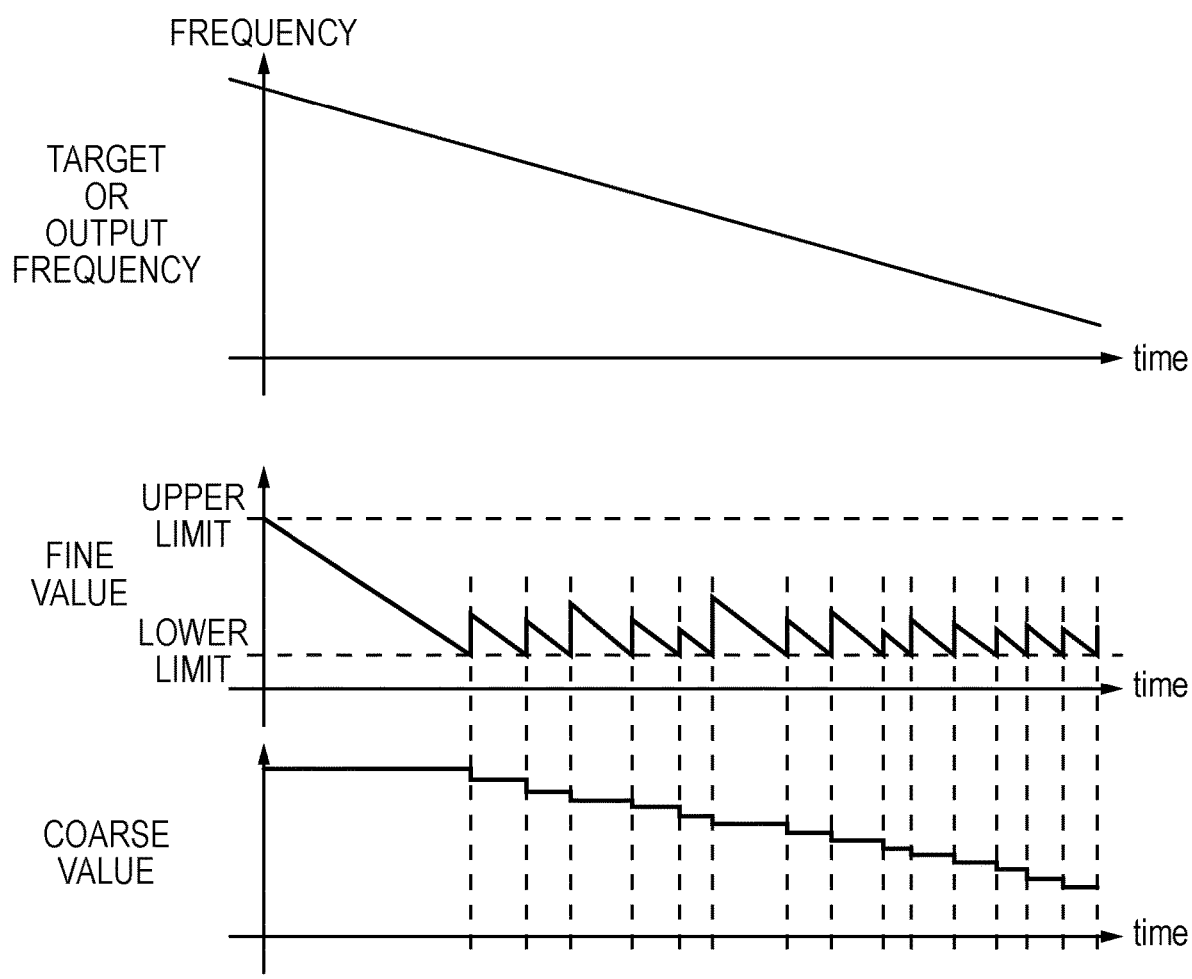
FIGS. 3 and 4 are signal diagrams useful for understanding operation of the oscillating circuitry of FIG. 1 and its calibration, temperature-correction and operational modes.
Figure 4:
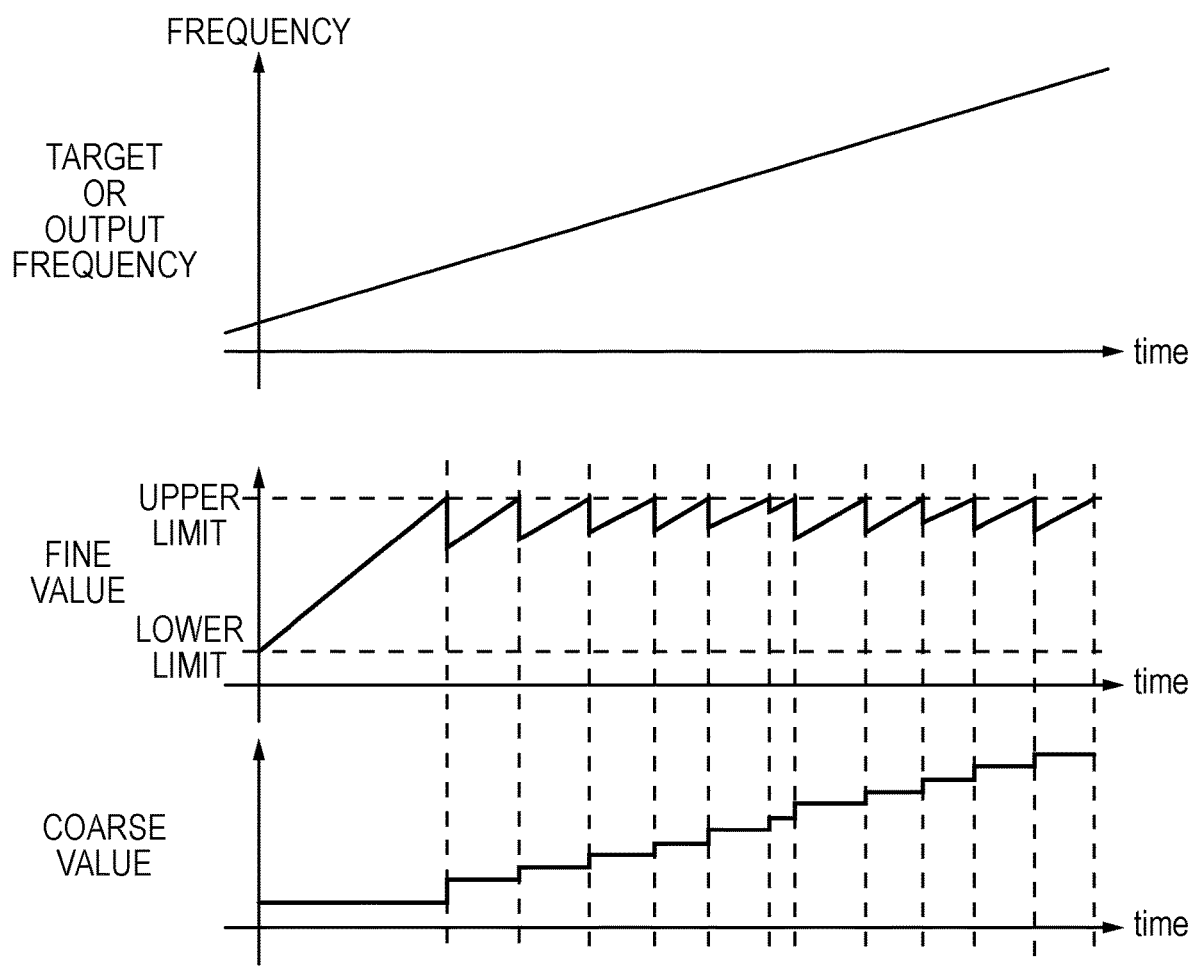

FIGS. 3 and 4 present signal diagrams useful for understanding such operation of the oscillating circuitry 100, although the loop shown in FIG. 2 is only partly represented in each of FIGS. 3 and 4.

In FIG. 3, the starting point 2 of FIG. 2 is assumed and the target frequency is progressively decreased (see the uppermost signal diagram in FIG. 3). Thus, the fine value (see the middle signal diagram in FIG. 3) decreases from the upper limit value to the lower limit value as the uppermost diagonal line (with the highest coarse value) is traversed downwards, and then there follows a series of transitions between bands. Each transition between bands (i.e. each band change) corresponds to a coarse value change (see the lowermost signal diagram in FIG. 3) with a fine value change occurring when that coarse value change occurs. Those fine value changes correspond to vertical jumps (i.e. sudden or quick changes—e.g. based on the control loop operation quickly settling) in fine value in the middle signal diagram of FIG. 3, and those fine value changes may be measured and recorded (e.g. stored in memory, such as a register). It should be noted that the number of bands in FIG. 3 happens to be different from that in FIG. 2. Between the band changes (i.e. the coarse value changes) the fine value decreases back down to the lower limit value as the target frequency is progressively decreased. A similar pattern can be seen in FIG. 2.

In FIG. 4, the starting point 3 of FIG. 2 is assumed and the target frequency is progressively increased (see the uppermost signal diagram in FIG. 4). Thus, the fine value (see the middle signal diagram in FIG. 4) increases from the lower limit value to the upper limit value as the lowermost diagonal line (with the lowest coarse value) is traversed upwards, and then there follows a series of transitions between bands. Each transition between bands (i.e. each band change) corresponds to a coarse value change (see the lowermost signal diagram in FIG. 4) with a fine value change occurring when that coarse value change occurs. Those fine value changes correspond to vertical drops (i.e. sudden or quick changes—e.g. based on the control loop operation quickly settling) in fine value in the middle signal diagram of FIG. 4, and those fine value changes may be measured and recorded (e.g. stored in memory). The number of bands in FIG. 4 happens to be different from that in FIGS. 2 and 3. Between the band changes (i.e. the coarse value changes) the fine value increases back up to the upper limit value as the target frequency is progressively increased. Again a similar pattern can be seen in FIG. 2.

As a different example, the fine value changes could be measured by adjusting the coarse value when the fine value is at the relevant one of the upper and lower limit values, and then adjusting the fine value to maintain the output frequency. This could be carried out separately from the control loop operation, for example.

The calibration mode is carried out at the calibration temperature. That is to say, the temperature of the oscillating circuitry 100 and/or the controllable oscillator 102 is measured when the calibration mode is carried out, this measured temperature being the calibration temperature. Thus, the oscillating circuitry 100 (or the control circuitry 104, or the controllable oscillator 102) may comprise a temperature sensor (not shown) so that the calibration temperature can be measured. As another option, the calibration temperature may be supplied to the oscillating circuitry 100 (e.g. the control circuitry 104) during the calibration mode e.g. from an external temperature sensor. As another option, the calibration temperature may be pre-stored if it is assumed that the calibration mode will be carried out in controlled conditions.

The significance of this will become more apparent when considering the temperature-correction mode in more detail. In simple terms, the frequency position of the different frequency bands varies with temperature, for example with the bands (the diagonal lines) appearing to shift upwards in FIG. 2 with increasing temperature, the amount of the upwards shift also increasing with increasing temperature. Thus, the measurements of the distance between bands and the fine value changes relating to (associated with) the coarse value changes (band changes) in the calibration mode correspond specifically to the calibration temperature at which the measurements are carried out.

FIG. 5 is a table of example values useful for understanding operation of the oscillating circuitry of FIG. 1. For now, only columns A, B and C need be considered. The example values in FIG. 5 assume many more bands (i.e. coarse values) than indicated in FIGS. 2 to 4, however the same principles apply.

Five of the possible coarse value changes are listed, simply as examples. Column A indicates how far the coarse value changes are from the first one, which is used as a reference. Thus, the second coarse value change, from 90 to 91, has a distance of +5 from the first coarse value change, from 85 to 86. In practice, the coarse value may be incremented/decremented by 1.

Column C indicates the measured fine value changes associated with each of the coarse value changes. For example, the coarse value change from 95 to 96 (expressed as 95/96) has an associated measured fine value change of 1200, and the coarse value change from 100 to 101 (expressed as 100/101) has an associated measured fine value change of 900.

In some arrangements, the temperature-correction mode could be omitted. In that case, the control circuitry 104 is operable, in the operational mode, when one of the coarse value changes (or the coarse value change) is caused to occur, to impose its associated measured fine value change on the fine value and then continue with any further control-loop adjustments. Such imposing may be considered an overriding or temporary interruption of the control loop operation, or for example simply adding or subtracting an amount (corresponding to the fine value change) to/from the current fine value while the control loop operation continues, so that the control loop operation effectively continues based on the new fine value.

Figure 6:
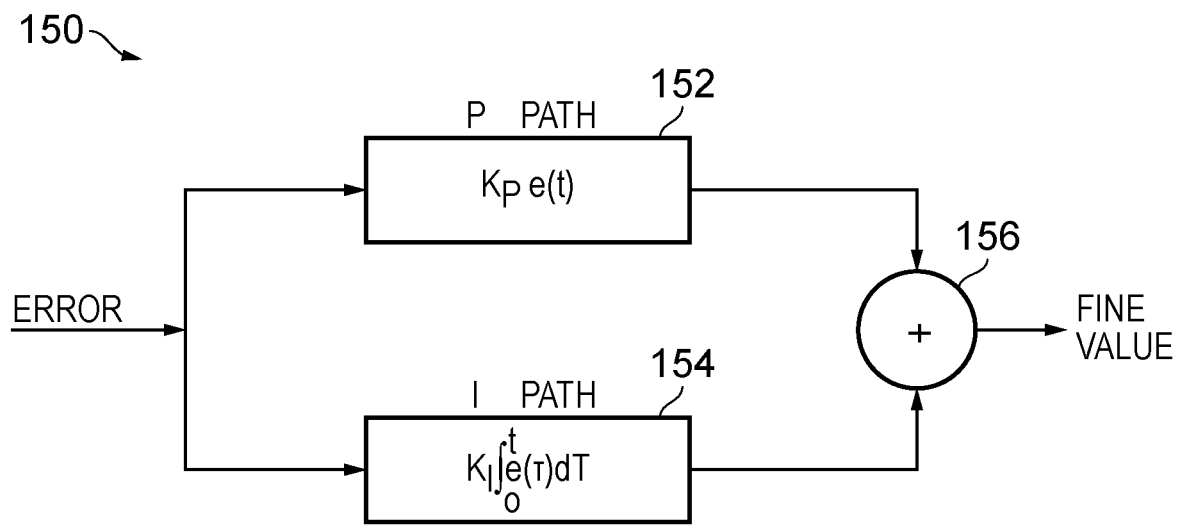
FIG. 6 is a schematic diagram using for understanding how the control loop operation of the oscillating circuitry of FIG. 1 may be implemented.

By way of a practical example, FIG. 6 is a schematic diagram of a loop filter 150 which may be implemented in the control circuitry 104 to carry out part of the control loop operation. The loop filter 150 is a PI (Proportional-Integral) loop filter, and thus has a P-path 152 and an I-path 154. Also provided is an adder 156 to generate the fine value (or a signal representative thereof) based on a summation of the results of the P-path 152 and I-path 154.

The loop filter 150 operates based on an input error signal as shown, for example indicating a difference between the output and target frequencies. In practice, this error signal may be generated by measuring a phase difference. The loop filter then controls the fine value based on proportional (P-path) and integral (I-path) terms, with a generalized example indicated in FIG. 6, and attempts to minimize the error over time by adjustment of that fine value. In this example, the adding or subtracting an amount (corresponding to the fine value change) to/from the current fine value as mentioned above may be implemented by applying the addition/subtraction to the I-path 154. This has the advantage of not using any additional logic and constituting an elegant design solution.

The imposing of the measured fine value changes, when the associated coarse value changes occur, enables the control loop operation to more quickly "lock" on to the desired output frequency, reducing glitches or jitter (noise) when the coarse values change.

With this in mind, so-called "default" fine value changes (corresponding to the measured fine value changes, but configured or stored in advance) could be imposed in the calibration mode, so that even while the measured fine value changes are being measured the control loop operation is helped to more quickly "lock" on to the desired output frequency so that glitches or jitter (noise) can be reduced. Example such default fine value changes are indicated in column F of FIG. 5—note that they are close to but happen not to be the same as the corresponding measured fine value changes in column C (except for—perhaps by coincidence—at the reference coarse value change 85/86).

As mentioned above, the measured fine value changes are measured at the calibration temperature and so have their best noise-reduction effect when the operational mode is carried out at that temperature. If other temperatures are experienced, however, then even by using the measured fine value changes the oscillating circuitry 100 suffers a degree of glitches or jitter (noise), albeit perhaps reduced as compared to not using fine value changes at all.

To enable improved operation across a range of temperatures, the temperature-correction mode is employed. Such arrangements are considered advantageous given that the oscillating circuitry 100 may be required to operate over a wide temperature range, such as −20° C. to +80° C. (or even wider).

The control circuitry 104 is configured, in the temperature-correction mode, to correct each or any of the measured fine value changes to account for a temperature different from the calibration temperature at which its associated coarse value change would be expected to occur under the control loop operation with the operational target frequency.

Figure 7:
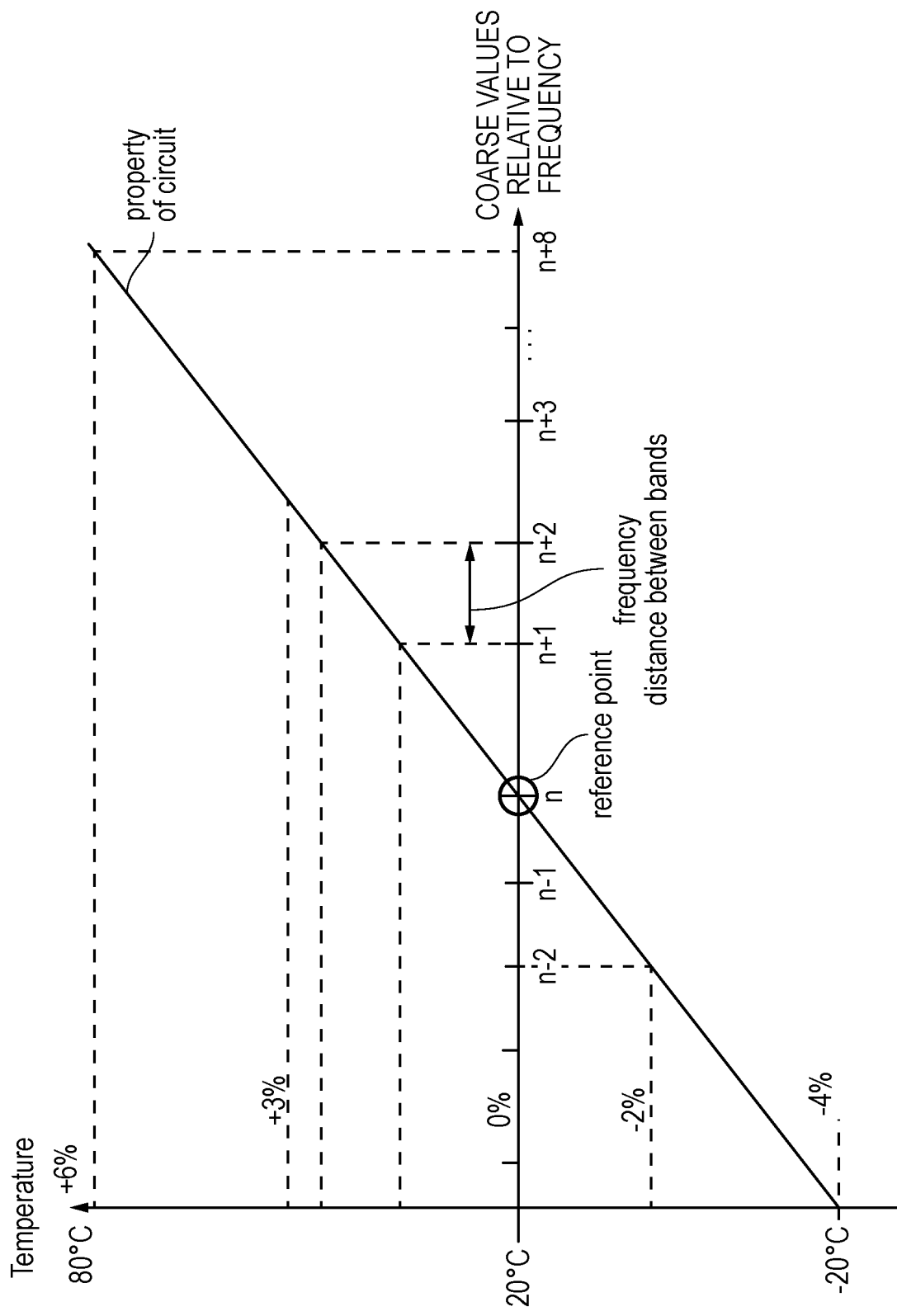
FIG. 7 is a graph useful for understanding the temperature-correction mode.

In order to explore this further, reference is made to FIG. 7 which is a graph useful for understanding the temperature-correction mode. The y-axis indicates temperature and the x-axis indicates the coarse values relative to frequency (representing the frequency positions of the different frequency bands). Thus, where the different bands appear along the x-axis depends on the frequency distance between the bands as indicated in FIG. 2 and discussed above. Also indicated along the y-axis are percentages by which the measured fine value changes should be adjusted to take account of temperature.

Thus, the diagonal trace on FIG. 7 represents a property (e.g. a temperature coefficient) of the circuitry, and may for example have been obtained by measuring the performance of many similar circuits under a range of temperature conditions. The information presented in FIG. 7 may be considered temperature-dependence information and may be stored in the control circuitry 104 for use in the temperature-correction mode.

Accordingly, looking at FIG. 7, the point where the diagonal trace intersects the x-axis is taken as a reference point. This is assumed to indicate the coarse value at which the oscillating circuitry 100 is intended to operate (i.e. where the operational target frequency will be achieved), and also the calibration temperature. In the example of FIG. 7, the calibration temperature is 20° C. and the operational temperature range is from −20° C. to +80° C.

Looking back to FIG. 2, the starting point 1 could for example be equated with the reference point in FIG. 7. Given a known calibration temperature (e.g. known through measuring it) and a known operational temperature range (e.g. a design requirement), the calibration mode may be configured so that the coarse value for the operational frequency is positioned within the range (an operational range) of coarse values which are covered by the calibration mode relative to the position of the calibration temperature within the operational temperature range. Thus, if the calibration temperature is 20° C. and the operational temperature range is from −20° C. to +80° C., the coarse value for the operational frequency may be positioned within the range of covered coarse values so that 40% of them are below the coarse value for the operational frequency and 60% of them are above.

In the temperature-correction mode, the measured fine values may thus be corrected by reference to the information in FIG. 7. For example, in the FIG. 7 example the band (coarse value) n+8 corresponds to 80° C. and the measured fine value for that band should be corrected by +6% (so a measured fine value of 100 would be corrected to 106). As another example, the band (coarse value) n−2 corresponds to a correction by −2%.

Example corrected fine value changes have been entered into column D of the example table of FIG. 5, along with an indication of the percentage correction, based on temperature-dependence information such as (but not the same as) that shown in FIG. 7. For example, in FIG. 5 the band change (coarse value change) 85/86 is taken as the reference point and thus no (0%) correction is indicated in column D, whereas the band change (coarse value change) 95/96 has a +3% correction applied in column D (1200 has been corrected to 1236).

The control circuitry 104 is then operable (in arrangements which employ the temperature-correction mode) to take advantage of the corrected fine value changes. In such arrangements the control circuitry 104 is operable, in the operational mode, when one of the coarse value changes (or the coarse value change) is caused to occur, to impose its associated corrected fine value change on the fine value and then continue with any further control-loop adjustments.

As before, such imposing may be considered an overriding or temporary interruption of the control loop operation, or for example simply adding or subtracting an amount (corresponding to the fine value change) to/from the current fine value while the control loop operation continues, so that the control loop operation effectively continues based on the new fine value. The use of the loop filter 150 of FIG. 6 thus applies equally here, and duplicate description is omitted. The imposing of the corrected fine value changes, when the associated coarse value changes occur (presumed to be due to a temperature change), enables the control loop operation to more quickly "lock" on to the desired output frequency, reducing glitches or jitter (noise) when the coarse values change, even over the operational temperature range which is particularly advantageous.

Incidentally, in the same way that default fine value changes could be imposed in the calibration mode with the actual fine value changes then measured, so the corrected fine value changes could be imposed in the operational mode with the actual fine value changes still measured. That is, even the corrected fine value changes (since they are based on temperature-dependence information which may have been generated based on a plurality of other—albeit similar—circuits) may not be accurate for the particular oscillating circuitry 100. Such measurements could then be used to update the corrected fine value changes, so that the oscillating circuitry 100 effectively "learns" its own performance over time. This may be referred to as "learn mode", which may occur during the operational mode.

That is, every time a coarse value occurs during the operational mode, the imposed corrected fine value change may help the control loop operation more quickly "lock" on to the desired output frequency so that glitches or jitter (noise) can be reduced, but further locking on may be required leading to a slightly different fine value change which could be measured. Thus, over time, the corrected fine value changes in column D of FIG. 5 may become updated as in column E, to reflect the particular oscillating circuitry 100.

Note that although separate columns C, D, E and F are provided in FIG. 5 for ease of explanation, the oscillating circuitry 100 may only have (or have access to) storage for one fine value change per coarse value change, with that value being overwritten each time it is changed. For example, for a given coarse value change, the default value may be initially stored before the calibration mode, following which the default value is overwritten with the measured value. Following the temperature-correction mode, the measured value would then be overwritten with the corrected value, and during the operational mode the corrected value may be overwritten with an updated (or newly corrected) value. All such updated values could be referred to as corrected values. The present disclosure will be understood accordingly.

Such updating may be carried out each time a measured fine value change during the operational mode is different from the corresponding current "corrected fine value change", to adopt the newly-measured "corrected fine value change". However, such a process may suffer from high-frequency noise. Instead, the updating could be subject to an averaging process (e.g. a moving average) so as to reject to an extent such high-frequency noise.

Note that the temperature-correction mode may be entered before the operational mode so that all of the measured fine value changes are corrected at that time. However, another approach would be to carry out such correction only when it is needed. For example, it would be possible while in the operational mode to enter the temperature-correction mode when it appears that a measured fine value change is about to be needed and to correct that fine value change then.

Figure 8:
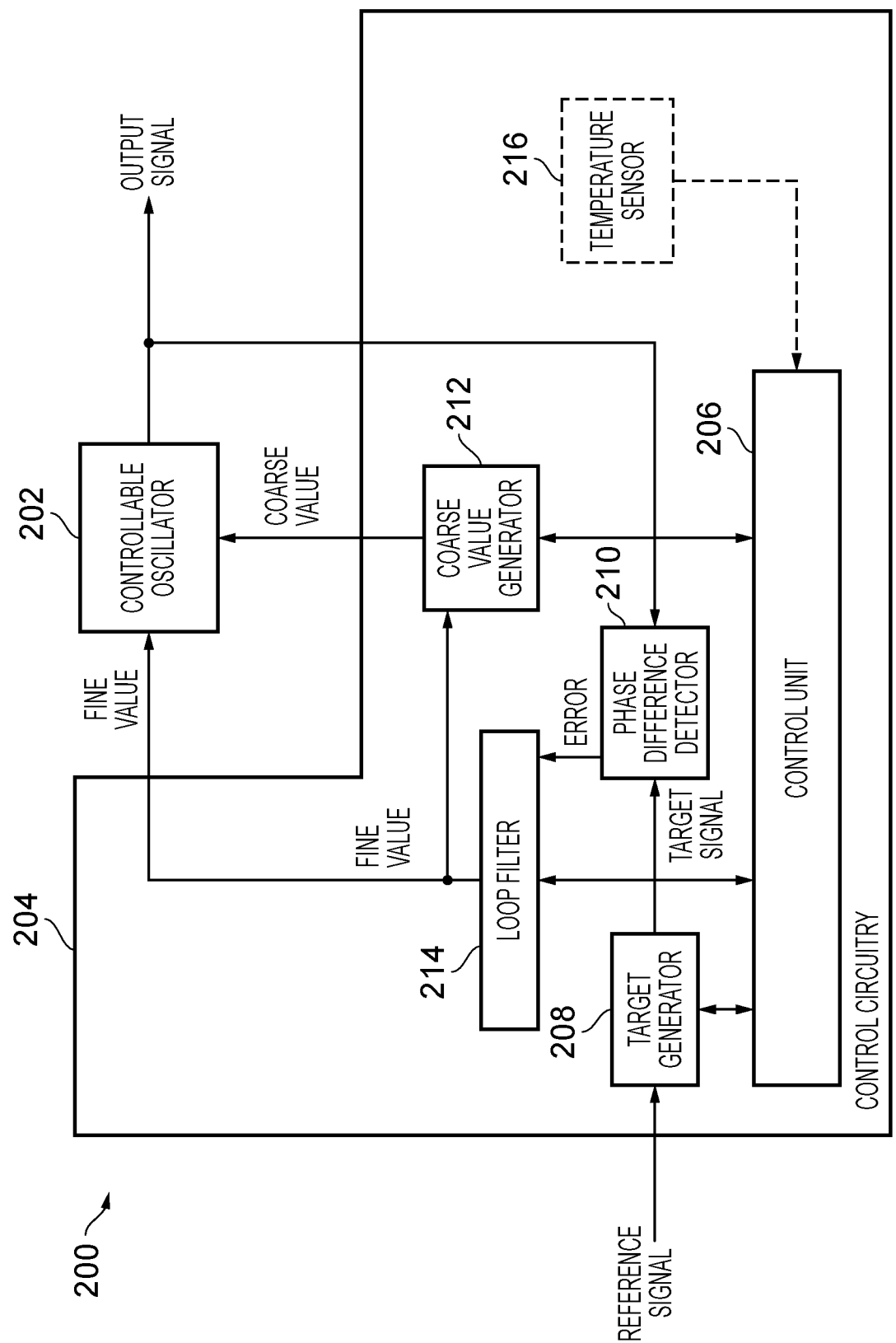
FIG. 8 is a schematic diagram of a detailed implementation of oscillating circuitry embodying the present invention.

FIG. 8 is a schematic diagram of oscillating circuitry 200 being a detailed implementation of the oscillating circuitry 100 of FIG. 1. The controllable oscillator 202 corresponds to the controllable oscillator 102 and the control circuitry 204 corresponds to the control circuitry 104 so that the functionality described above applies here and duplicate description may be omitted.

The control circuitry 204 comprises a control unit 206, a target generator 208, a phase difference detector 210, a coarse value generator 212 and a loop filter 214. The control circuitry 204 may also comprise a temperature sensor 216 although this is optional.

The control unit 206 generally controls the control circuitry 204. The target generator 208 is connected to receive the reference signal and generate the target signal having the target frequency based on control by the control unit 206. The phase difference detector 210 is connected to receive the target signal and the output signal and output an error signal dependent on a phase difference between those signals.

The loop filter 214 is controlled by the control unit 206 and is operable to receive the error signal from the phase difference detector 210 and output a fine value signal based thereon. The fine value signal is supplied to the controllable oscillator 202. Reference may be made to the loop filter 150 of FIG. 6 which may be implemented in the loop filter 214. For example, the control unit 206 may be operable to make additions/subtractions to the I-path as discussed in connection with FIG. 6.

The coarse value generator 212 is controlled by the control unit 206 and is connected to receive the fine value signal output from the loop filter 214. The coarse value generator 212 generates a coarse value signal which is supplied to the controllable oscillator 202. Under control loop operation, for example, the coarse value generator 212 is configured to make a coarse value change when the fine value reaches the upper or lower limit value as described above. The control unit 206 may be operable to control the coarse and fine values directly, i.e. independently of control loop operation.

The temperature sensor 216, if provided, is operable to provide temperature information to the control unit 206, for example so that it is aware of the calibration temperature. As another option, the control unit 206 may be informed of the calibration temperature via an external connection (not shown) to the control unit 206.

Figure 9:
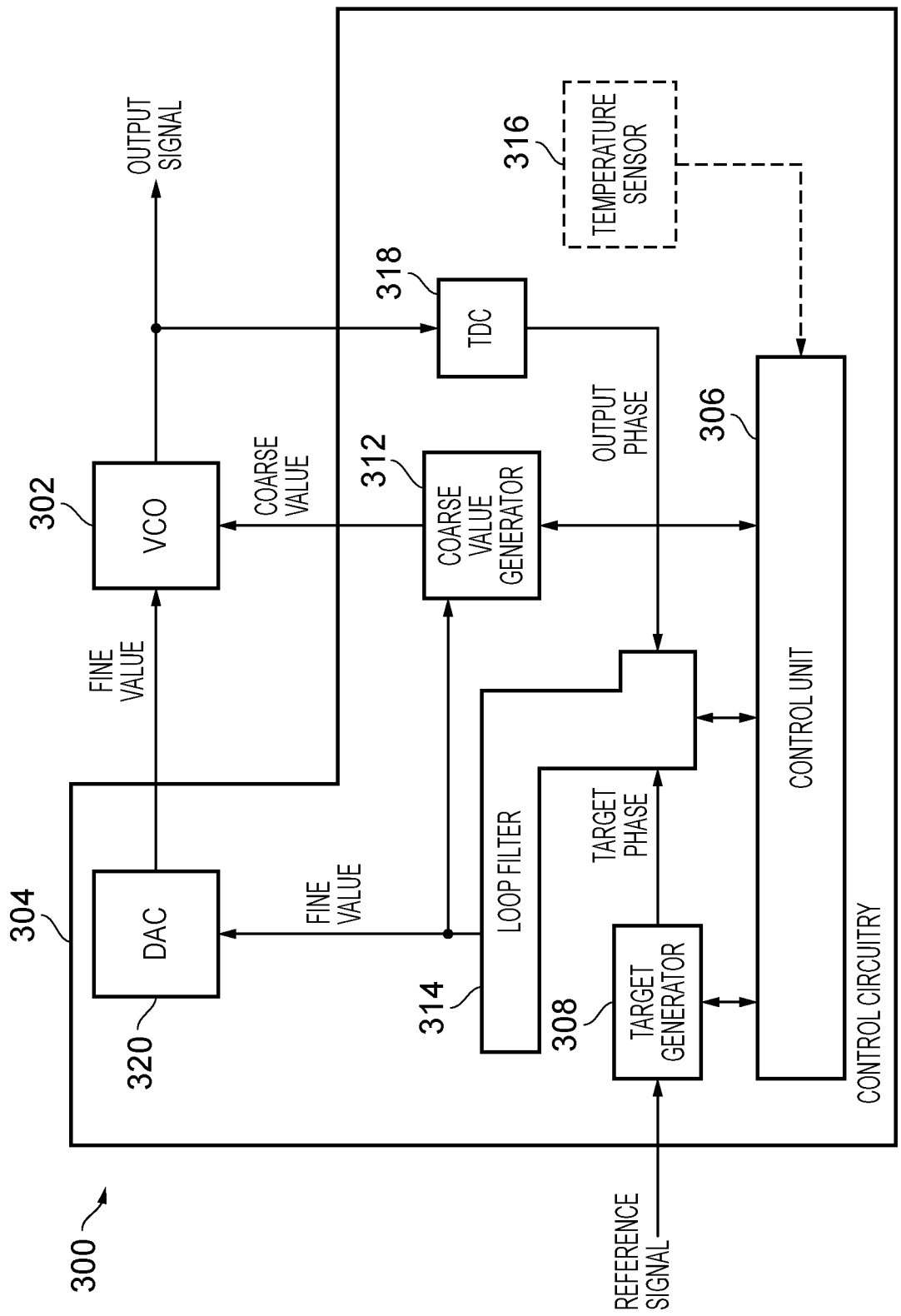
FIG. 9 is a schematic diagram of a further detailed implementation of oscillating circuitry embodying the present invention.

FIG. 9 is a schematic diagram of oscillating circuitry 300 being another detailed implementation of the oscillating circuitry 100 of FIG. 1. The controllable oscillator 302 corresponds to the controllable oscillator 102 and the control circuitry 304 corresponds to the control circuitry 104 so that the functionality described above applies here and duplicate description may be omitted.

The control circuitry 304 comprises a control unit 306, a target generator 308, a coarse value generator 312 and a loop filter 314. The control circuitry 304 may also comprise a temperature sensor 316 although this is optional. The control circuitry 304 further comprises a TDC (Time-to-Digital Converter) 318 and a DAC 320.

The control unit 306 generally controls the control circuitry 304. The target generator 308 is connected to receive the reference signal and generate target phase information (related to the target frequency) based on control by the control unit 306. The TDC 318 is connected to receive the output signal and to provide output phase information related to the output frequency and characterising the output signal.

The loop filter 314 is controlled by the control unit 306 and is operable to receive the output phase information and the target phase information. The loop filter 314 is then effectively configured to generate an error signal equivalent to that in FIG. 8 internally, during its operation. The loop filter 314 is then operable to output a fine value signal in line with that output by the loop filter 214. Reference may be made to the loop filter 150 of FIG. 6 which may be implemented in the loop filter 314. For example, the control unit 306 may be operable to make additions/subtractions to the I-path as discussed in connection with FIG. 6.

In FIG. 9, the fine value signal output by the loop filter 314 is a digital signal, which is converted to an analogue signal by the DAC 320 to be supplied to the controllable oscillator 302. The controllable oscillator 302 is implemented as a VCO.

The coarse value generator 312 is controlled by the control unit 306 and is connected to receive the digital fine value signal output from the loop filter 314. The coarse value generator 312 generates a digital coarse value signal which is supplied to the controllable oscillator 302. Under control loop operation, for example, the coarse value generator 312 is configured to make a coarse value change when the fine value reaches the upper or lower limit value as described above. The control unit 306 may be operable to control the coarse and fine values directly, i.e. independently of control loop operation.

The temperature sensor 316, if provided, is operable to provide temperature information to the control unit 306, for example so that it is aware of the calibration temperature. As another option, the control unit 306 may be informed of the calibration temperature via an external connection (not shown) to the control unit 306.

In the implementation of FIG. 9, the elements of the control circuitry 304 other than the DAC 304 and the TDC 318 are be digital elements, with the DAC 304 and the TDC 318 providing an interface to the analogue signals of the VCO 302. For example, the reference signal in FIG. 9 may be a digital signal.

It will be understood that some or all of the functionality for the calibration and temperature-correction modes may be provided externally from the oscillating circuitry disclosed herein, for example via an external connection. That external connection could then be removed for example once the corrected fine value changes have been stored in memory (not shown) of the oscillating circuitry. This could be useful (after an initial temperature sequence involving the calibration and temperature-correction modes) every time a restart (reset) occurs. The present disclosure will be understood accordingly.

Figure 10:
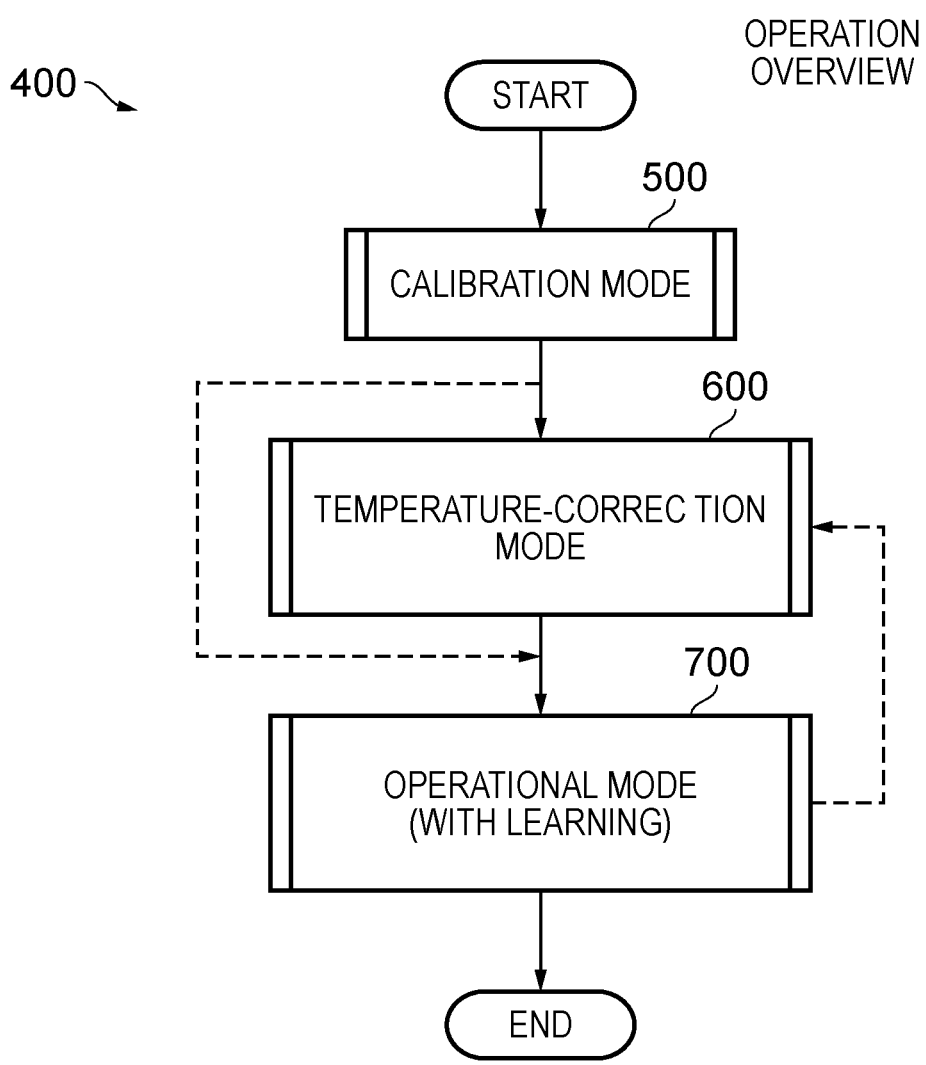
FIG. 10 is a flow diagram of a method corresponding to the overall operation of the oscillating circuitry of FIGS. 1, 8 and 9.

FIG. 10 is a flow diagram of a method 400 corresponding to the overall operation of the oscillating circuitry described herein.

As indicated, in certain arrangements the oscillating circuitry is configured to enter the calibration mode 500, followed by the temperature-correction mode 600 and then the operational mode 700 (which may involve learning as mentioned above). In this respect, the calibration mode 500 and temperature-correction mode 600 may be considered part of an initial setup phase, for example during manufacture/calibration of the circuitry, and the operational mode 700 may be considered part of a normal operation phase (when the circuitry is used by a user).

Figure 11:
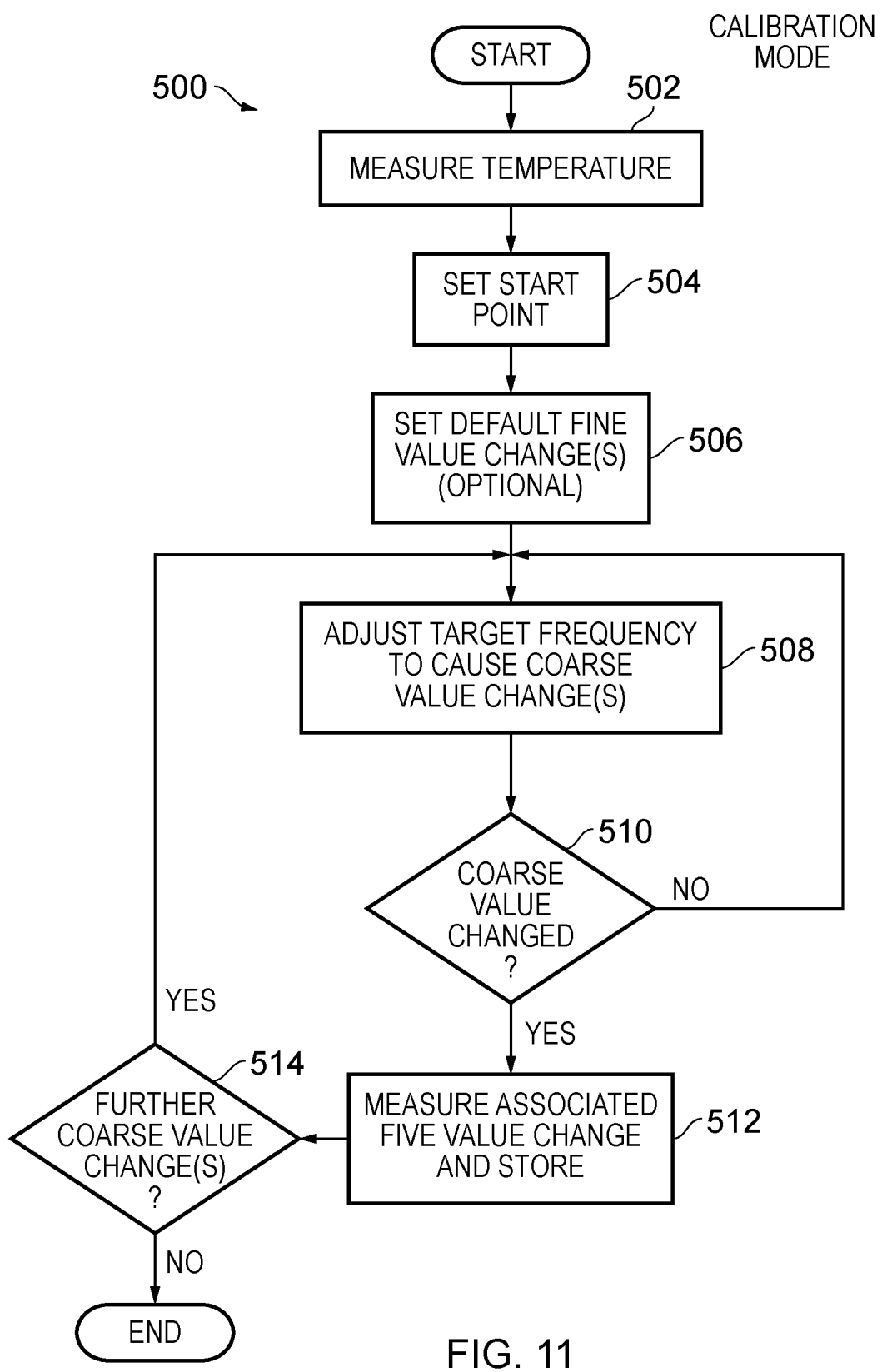
FIG. 11 is a flow diagram of a method corresponding to the calibration mode of the oscillating circuitry of FIGS. 1, 8 and 9.
Figure 12:
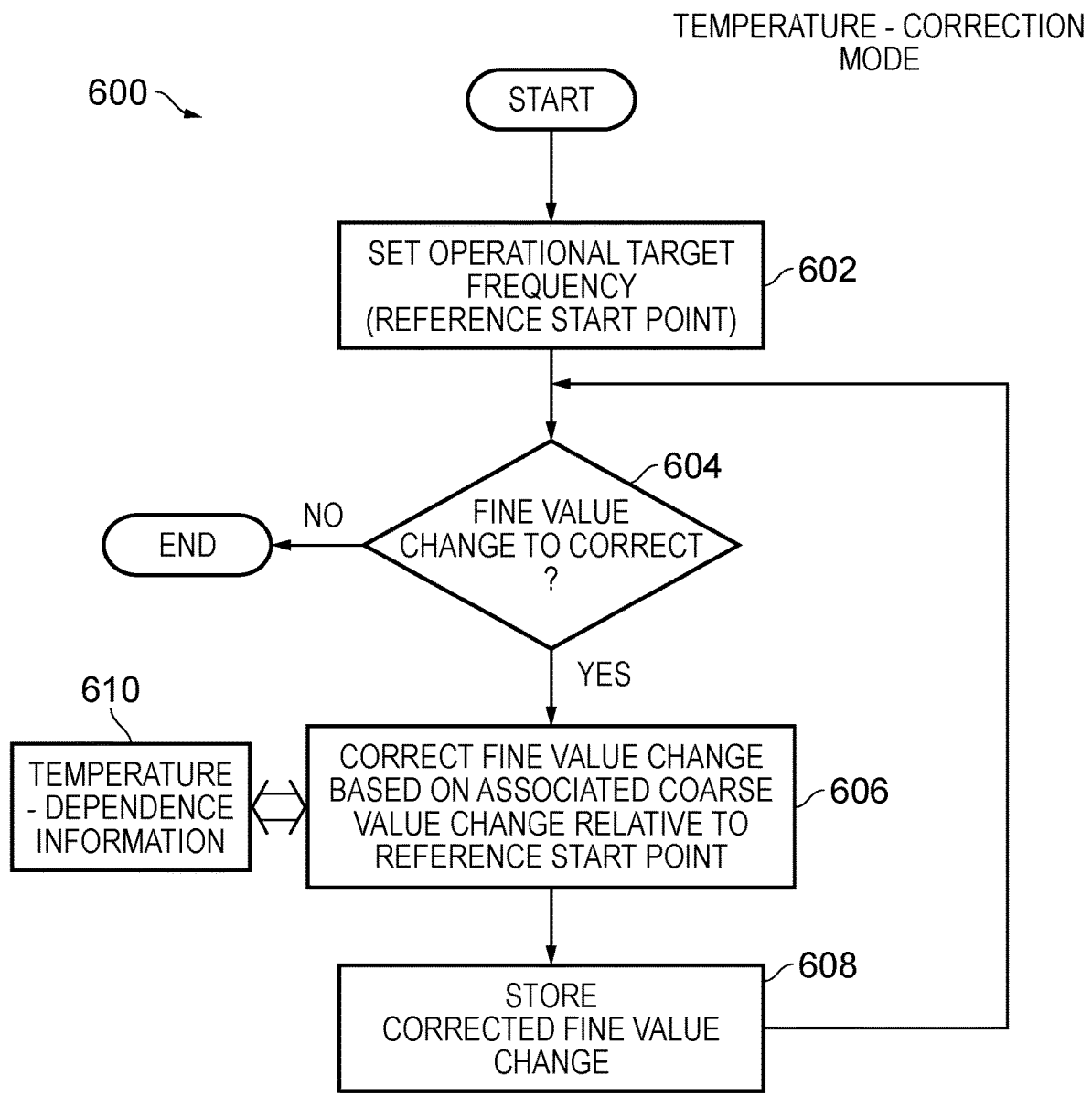
FIG. 12 is a flow diagram of a method corresponding to the temperature-correction mode of the oscillating circuitry of FIGS. 1, 8 and 9.
Figure 13:
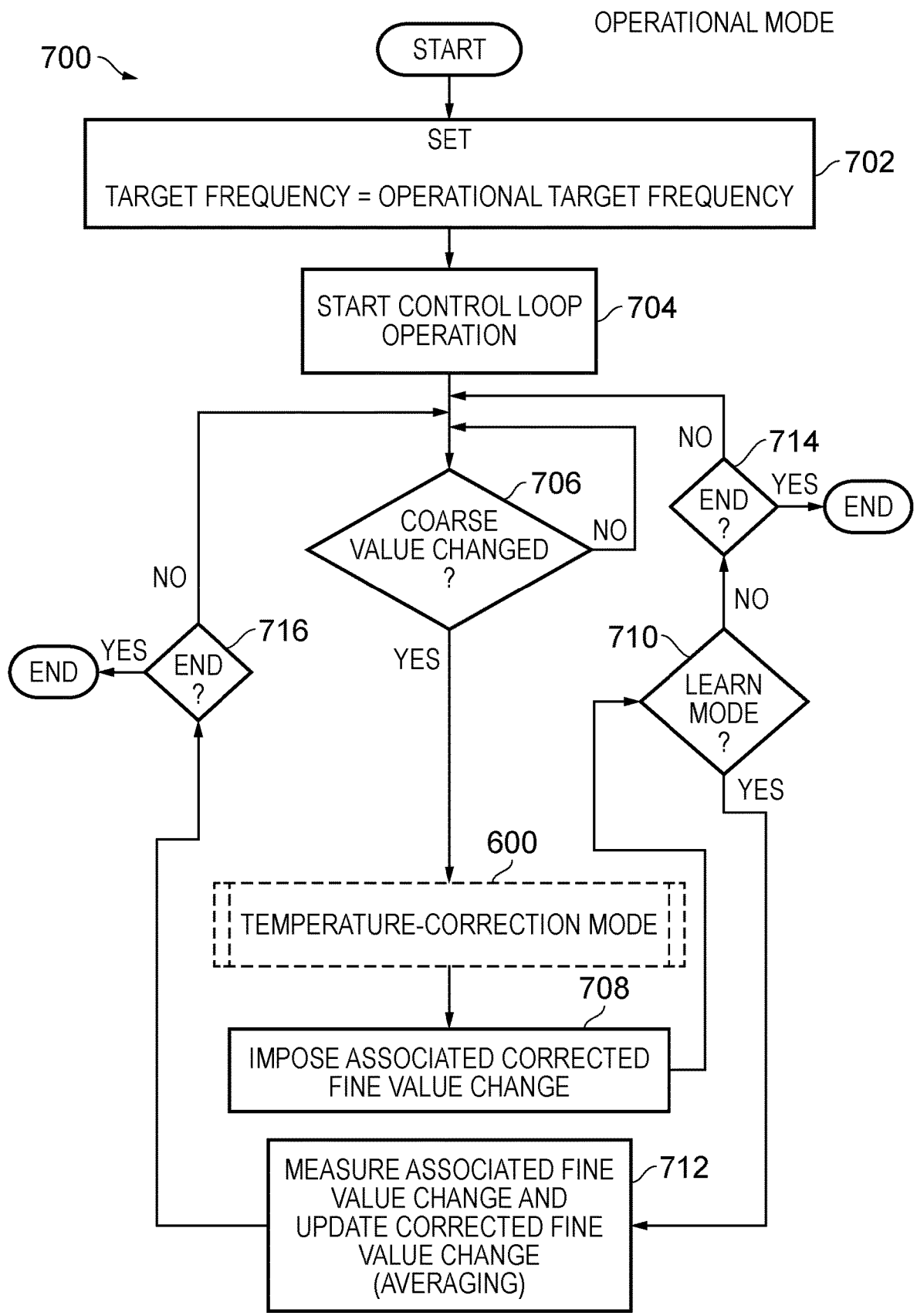
FIG. 13 is a flow diagram of a method corresponding to the operational mode of the oscillating circuitry of FIGS. 1, 8 and 9.

However, in other arrangements, the oscillating circuitry is configured to enter the calibration mode 500 and then proceed directly to the operational mode 700, followed by the entering the temperature-correction mode 600 when a corrected fine value change is about to be needed. The present disclosure will be understood accordingly. FIGS. 11 to 13 provide more detail regarding these modes.

FIG. 11 is a flow diagram of a method 500 corresponding to the calibration mode.

In step 502, the temperature is measured, so that the calibration temperature is known. As described earlier, this may be measured by a temperature sensor which is part of the oscillating circuitry or by an external sensor. As another option, if the calibration mode is performed under controlled conditions for example, the calibration temperature could be predetermined and known, and step 502 effectively skipped.

The method then proceeds to step 504, where the start point or reference point is set. This may for example correspond to the starting point 1 in FIG. 2, from which a loop such as the loop in FIG. 2 may be followed to find the relevant measured fine value changes, and be set based on the calibration temperature so that the number of bands (coarse values) above and below that at the start point corresponds to the position of the calibration temperature within the operation range of temperatures. This is so that there is a suitable number of bands above and below the start point which have been calibrated to cover the operational temperature range. If the calibration mode is performed under controlled conditions, with the calibration temperature predetermined and known, the start point could also be predetermined and known and the step 504 effectively skipped.

The method then proceeds to step 506, where there is the option of setting one or more default fine value changes as described in connection with column F of FIG. 5. As described earlier, this step is optional, but if employed can reduce the jitter/noise suffered in the output signal during the calibration mode. It may for example be that only certain default fine value changes are provided and used.

The method then proceeds to the cycle defined by steps 508, 510, 512 and 514, where the target frequency is adjusted to cause the necessary coarse value changes to occur to cover the frequency bands (coarse values) of the operational range of bands. Each time one of the required coarse value changes occurs (YES, step 510), the associated fine value change is measured and stored (step 512), for example in memory such as a register. If further coarse value changes need to be covered, the cycle then repeats (YES, step 514). Otherwise, the method ends (NO, step 514). In this way, values corresponding to those in column C of FIG. 2 are obtained.

The cycle defined by steps 508, 510, 512 and 514 may involve following a loop as indicated in bold in FIG. 2 or for example jumping to the relevant points on the loop (around the upper and lower limit values) to take the measurements. Following the loop may advantageously allow for simple control, effectively detuning the operational target frequency up and down. It may be that only one band transition (coarse value change) need be covered to cover the operational range.

FIG. 12 is a flow diagram of a method 600 corresponding to the temperature-correction mode.

In step 602, the operational target frequency is set, to define a reference start point which may also correspond to the starting point 1 in FIG. 2. If the coarse values (bands) covered in the calibration mode are arranged above and below the starting point 1 relative to the position of the calibration temperature within the operational range of temperatures, then it may be helpful for the reference start point in step 602 to be the same as the starting point in step 504. However, the two start points could be different.

The method then proceeds to the cycle defined by steps 604, 606 and 608, where if there is a measured fine value change to correct (YES, step 604), that measured fine value change is corrected based on the frequency position of the associated coarse value change relative to that of the reference start point. Thus, temperature-dependence information may be accessed (step 610) as described in connection with FIG. 7 to perform the correction concerned (step 606), and the corrected fine value change is then stored (step 608), for example in memory such as a register. As described earlier, this storing may involve overwriting the corresponding measured fine value change, so that the overall memory requirement is minimised. If further measured fine value changes are to be corrected in the present running of method 600, the cycle then repeats (YES, step 604). Otherwise, the method ends (NO, step 604). In this way, values corresponding to those in column D of FIG. 2 are obtained.

As mentioned in connection with FIG. 10 and previously, the oscillating circuitry is configured to enter the calibration mode 500 and then proceed directly to the operational mode 700, followed by the entering the temperature-correction mode 600 when a corrected fine value change is about to be needed. Thus, it may be that each time method 600 is run only one or only a subset of the available measured fine value changes (i.e. not yet corrected) are corrected. That is, method 600 may be run during the running of method 700 (see FIG. 13) when a particular corrected fine value change is about to be needed.

FIG. 13 is a flow diagram of a method 700 corresponding to the operational mode.

In step 702, the target frequency is set to be the operational target frequency, and the method then proceeds to step 704 where control loop operation is started (or continued).

The method then proceeds to the cycle defined by steps 706, 708, 710 and 714, assuming that "learn mode" is not enabled (NO, step 710). In this cycle, under the control loop operation with the operational target frequency, if there is a coarse value change (YES, step 706) the associated corrected fine value change is imposed (step 708) and the control loop operation continues in this way (NO, steps 710 and 714) until operation is stopped (YES, step 714). Note that the method 600 has been inserted between steps 706 and 708 to allow the relevant measured fine value change to be corrected as part of method 700 if it has not already been corrected in a separate running of method 600.

Although method 600 has been inserted between steps 706 and 708, it could appear instead immediately before step 706 (or elsewhere on the cycle) to allow the correction to be performed just before the coarse value change occurs, to avoid a delay associated with performing the correction.

If the "learn mode" is enabled (YES, step 710), the method proceeds from step 704 to the cycle defined by steps 706, 708, 710, 712 and 716. In this cycle, under the control loop operation with the operational target frequency, if there is a coarse value change (YES, step 706) the associated corrected fine value change is imposed (step 708) and then the actual fine value change which occurs (based on the control loop operation settling as the coarse value change occurs) is measured (step 712) so that the corresponding corrected fine value change can be updated (step 712). As described earlier, this updating may involve overwriting the corresponding corrected fine value change, and may involve using an averaging process (e.g. a moving average) to take account of a history of updates to that fine value change. If such a history of updates is taken into account, corresponding memory of those updates may be needed. The control loop operation continues in this way (NO, step 716) until operation is stopped (YES, step 716). Again, note that the method 600 has been inserted between steps 706 and 708; the same considerations apply as mentioned above in this respect.

Figure 14:
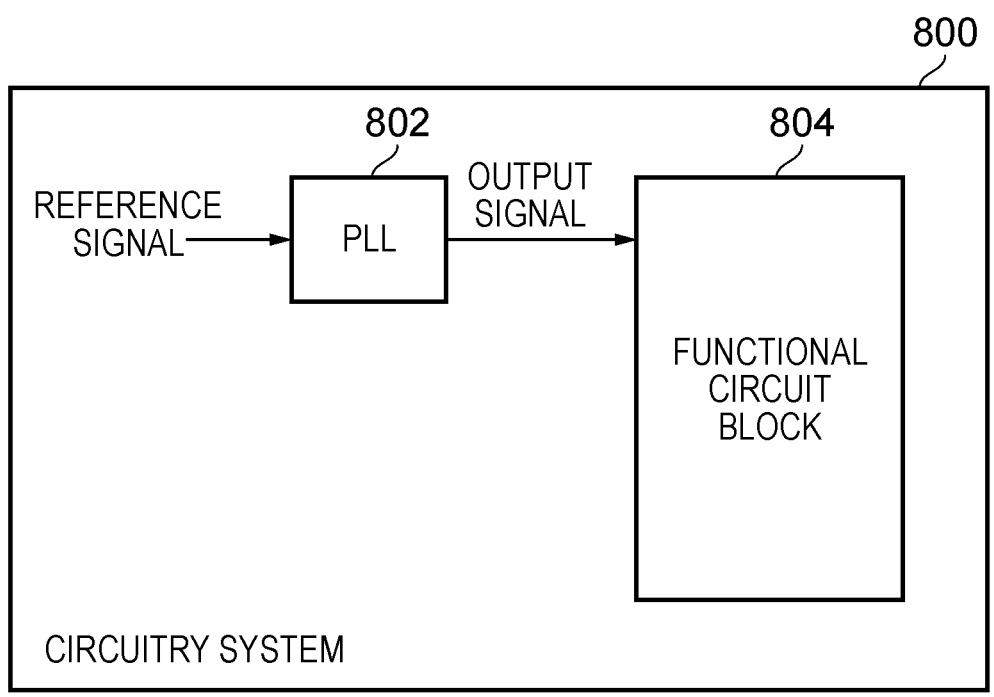
FIG. 14 is a schematic diagram of a circuitry system embodying the present invention.

FIG. 14 is a schematic diagram of a circuitry system 800 embodying the present invention. The circuitry system comprises oscillating circuitry 802, which may be a PLL as mentioned above, and a functional circuit block 804. The oscillating circuitry 802 may be or comprise the oscillating circuitry 100, 200 or 300.

The functional circuit block 804 is operable based on the output signal supplied by the oscillating circuitry 802. For example, the output signal may be a clock signal based on which the functional circuit block 804 operates. In this way, the functional circuit block 804 may enjoy the low jitter, low noise output signal as generated by the oscillating circuitry 802, for example even over a wide operational temperature range as discussed above. The functional circuit block 804 may be any circuitry operable based on the output signal, for example a digital processing block or a DAC or ADC (Analogue-to-Digital Converter).

In summary, with previously-considered circuitry, the useable temperature range for the VCO (controllable oscillator) has been found to be very small, if satisfactory noise performance is required. Implementing analogue compensation as a solution has been considered difficult and could require external components.

As above, the circuitry disclosed herein may be substantially implemented in digital circuitry, and allows noise-performance problems to be overcome in a very efficient way by manipulating the coarse and fine tuning interface in a way that avoids or reduces jitter/noise (distortions to the VCO output) associated with the switching of the coarse tuning interface. Recall that in the operational mode the temperature drift of the VCO (controllable oscillator) is such that the operation cannot stay on a single coarse value (band) for the whole operational temperature range.

The frequency bands (associated with the coarse values) are not equally distributed and may vary over temperature. One difficulty is to find the frequency step or distance between the bands, as discussed above. As the temperature drift causes a frequency change, it is possible to simulate the temperature drift by changing the target frequency. This will however not reflect a real temperature change but will show the frequency distance between the bands at a specific (calibration) temperature. The temperature coefficient for the band distances may then be characterized with different samples (i.e. by measuring this across several similar circuits, e.g. chips), producing measured temperature-dependence information. The measured temperature-dependence information can then be used to assess the correct frequency distances between the bands and in turn correct the measured fine value changes as discussed in detail above.

A first step may thus be to measure the frequency distance between the bands that might be required to work over the desired operational temperature range. As the oscillating circuitry (e.g. PLL) is designed as a fractional PLL, it is possible to detune the (controllable oscillator) VCO over the desired frequency range (which corresponds in the operational mode to the temperature range). A calibration state machine may be provided to automatically de-tune the VCO in this way, for example in line with the bold loop in FIG. 2.

Depending on the temperature at calibration (the calibration temperature), the state machine may detune a programmable number of coarse steps (coarse value changes) up and down relative to the start point. This helps to limit the tuning steps required. For example, it may be that fine value changes corresponding to only e.g. 32 coarse value changes can be stored. As example with a 25° C. start temperature (calibration temperature) and a range of −20° C. to 80° C. (−45/+55° C.) the state machine may be configured to tune 17 coarse steps (coarse value changes) up and 15 coarse steps down from the start point.

The decision when to change coarse value can be programmed to a defined fine value (an upper or lower limit value). Once this limit is reached (upper or lower), the calibration state machine will measure the fine value (e.g. DAC control value, see FIGS. 2 and 9) before and after the coarse value change. The difference is then the associated measured fine value change and is used to compensate the frequency difference to a minimum when the coarse value changes in the operational mode. For example, the difference may be added/subtracted from the DAC value at the same time as the coarse value changes in the operational mode. This addition/subtraction may be applied to the I-path of the internal PI-loop filter 150 as described in relation to FIG. 6. This has the advantage of not using any additional logic and simplifies the design significantly.

This technique leads to a minimum of distortions to the VCO output (output signal) when the calibration interface (coarse value) is changing. To optimize the performance further, the skew between DAC switching (fine value tuning) and coarse switching should to be reduced to a minimum. Also the switching process itself should be as fast as possible to reduce the possibility of intermediate values to a minimum. Thermometer-coding may be possible in some implementations.

As above, the band distance is measured at a specific (i.e. calibration) temperature. The measured fine value changes can then be adjusted to incorporate also the temperature coefficient of the chip (i.e. the temperature-dependence information, which details how the bands move in frequency with temperature). The correction is done dependent on the frequency distance to the frequency of the reference point at the calibration temperature, as is apparent with reference to FIG. 7. With the temperature coefficient of the VCO (temperature-dependence information) and the band distance known, the control circuitry (e.g. implemented in software) can calculate the compensation factor (or correction amount) for each measured fine value change individually.

The temperature compensation/correction logic also allows a corrected fine value change to be updated each time the coarse value (calibration interface value) changes in the operational mode. Once band switching (a coarse value change) due to an actual temperature change occurs, the actual fine value change may be measured and stored (see the updated values in column F of FIG. 5). The update value can then be re-used the next time the temperature causes that coarse value change. This feature is referred to herein as a "learn mode" (see FIG. 13, step 710) and allows to reduce jitter/distortion/noise further.

Looking back to FIGS. 1, 8 and 9 for example, and taking account of the functionality of the control circuitry in each case, it will be appreciated that parts of the circuitry disclosed herein may be implemented in hardware, or as software modules running on one or more processors, or on a combination thereof. That is, those skilled in the art will appreciate that a microprocessor or digital signal processor (DSP) may be used in practice to implement some or all of the functionality described above. For example, the functionality of the elements in the control circuitry 304 other than the TDC 318 and DAC 320 may be implemented in hardware (e.g. digital circuitry) or as software modules running on a processor.

The invention may thus also be embodied as one or more device or apparatus programs (e.g. computer programs and computer program products) for carrying out part or all of the methods described herein. Such programs embodying the present invention may be stored on computer-readable media, or could, for example, be in the form of one or more signals. Such signals may be data signals downloadable from an Internet website, or provided on a carrier signal, or in any other form.

Figure 15:
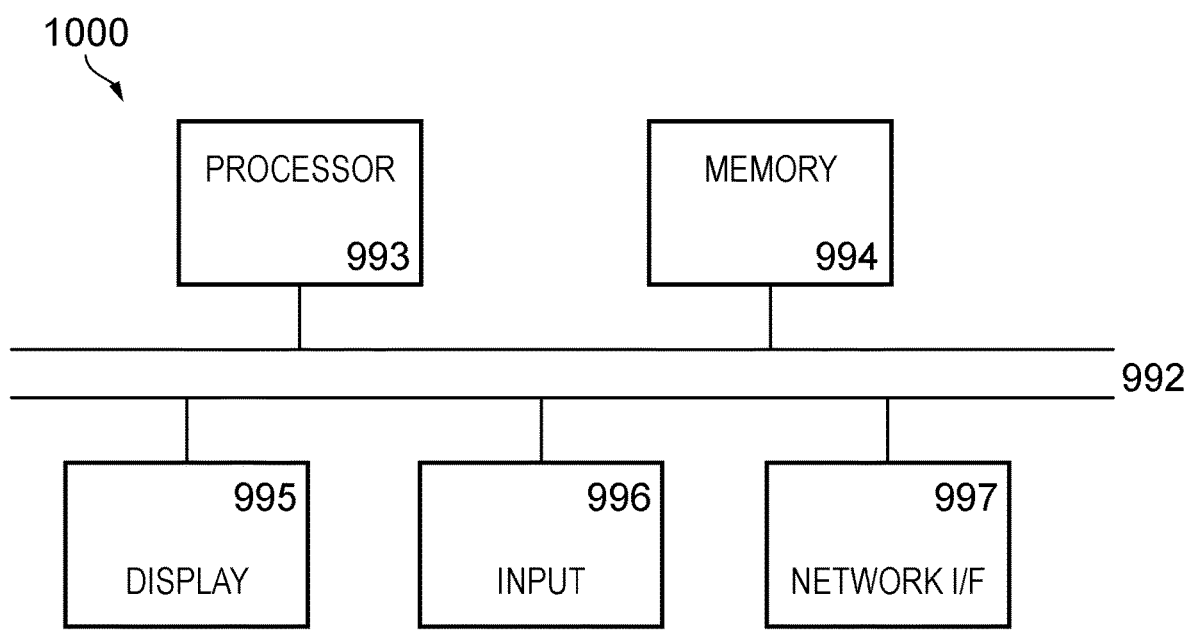
FIG. 15 is a block diagram of a computing device which may implement parts of the circuitry described herein.

FIG. 15 is a block diagram of a computing device 1000, which may be used to implement some or all of the steps of a method embodying the present invention, and perform some or all of the tasks of the oscillating circuitry. For example, the computing device 1000 of FIG. 15 may be used to implement all, or only part, of methods 400, 500, 600 and 700. As another example, the computing device of FIG. 15 could perform some or all of the functionality of the elements in the control circuitry 304 other than the TDC 318 and DAC 320.

The computing device comprises a processor 993, and memory, 994. Optionally, the computing device also includes a network interface 997 for communication with other such computing devices, for example with other computing devices of invention embodiments.

For example, an embodiment may be composed of a network of such computing devices. Optionally, the computing device also includes one or more input mechanisms such as keyboard and mouse 996, and a display unit such as one or more monitors 995. The components are connectable to one another via a bus 992.

The memory 994 may include a computer readable medium, which term may refer to a single medium or multiple media (e.g., a centralized or distributed database and/or associated caches and servers) configured to carry computer-executable instructions or have data structures stored thereon. Computer-executable instructions may include, for example, instructions and data accessible by and causing a general purpose computer, special purpose computer, or special purpose processing device (e.g., one or more processors) to perform one or more functions or operations. Thus, the term "computer-readable storage medium" may also include any medium that is capable of storing, encoding or carrying a set of instructions for execution by the machine and that cause the machine to perform any one or more of the methods of the present disclosure. The term "computer-readable storage medium" may accordingly be taken to include, but not be limited to, solid-state memories, optical media and magnetic media. By way of example, and not limitation, such computer-readable media may include non-transitory computer-readable storage media, including Random Access Memory (RAM), Read-Only Memory (ROM), Electrically Erasable Programmable Read-Only Memory (EEPROM), Compact Disc Read-Only Memory (CD-ROM) or other optical disk storage, magnetic disk storage or other magnetic storage devices, or flash memory devices (e.g., solid state memory devices).

The processor 993 is configured to control the computing device 1000 and execute processing operations, for example executing computer program code stored in the memory 994 to implement the methods or functionality mentioned above or defined in the claims. The memory 994 stores data being read and written by the processor 993. As referred to herein, a processor may include one or more general-purpose processing devices such as a microprocessor, central processing unit, or the like. The processor may include a complex instruction set computing (CISC) microprocessor, reduced instruction set computing (RISC) microprocessor, very long instruction word (VLIW) microprocessor, or a processor implementing other instruction sets or processors implementing a combination of instruction sets. The processor may also include one or more special-purpose processing devices such as an application specific integrated circuit (ASIC), a field programmable gate array (FPGA), a digital signal processor (DSP), network processor, or the like. In one or more embodiments, a processor is configured to execute instructions for performing the operations and steps discussed herein.

The display unit 995 may display a representation of data stored by the computing device and may also display a cursor and dialog boxes and screens enabling interaction between a user and the programs and data stored on the computing device. The input mechanisms 996 may enable a user to input data and instructions to the computing device.

The network interface (network I/F) 997 may be connected to a network, such as the Internet, and is connectable to other such computing devices via the network. The network I/F 997 may control data input/output from/to other apparatus via the network.

Other peripheral devices such as microphone, speakers, printer, power supply unit, fan, case, scanner, trackerball etc may be included in the computing device.

Methods disclosed herein may be carried out on a computing device such as that illustrated in FIG. 15. Such a computing device need not have every component illustrated in FIG. 15 and may be composed of a subset of those components.

The above-described embodiments of the present invention may advantageously be used independently of any other of the embodiments or in any feasible combination with one or more others of the embodiments.

The invention claimed is:

1. Oscillating circuitry, comprising:
   a controllable oscillator operable to generate an output signal having an output frequency dependent on a coarse value and a fine value, the coarse value causing the output frequency to be within an associated band of output frequencies and the fine value controlling the output frequency within that band; and
   control circuitry operable to generate the coarse and fine values so as to control the controllable oscillator,
   wherein, the control circuitry is operable:
   under control loop operation, based on a measurement indicative of a difference between the output frequency and a target frequency, to apply control-loop adjustments to the coarse and fine values to tend to maintain the output frequency at the target frequency;
   in a calibration mode at a calibration temperature, to measure a fine value change which occurs under the control loop operation when an associated coarse value change, corresponding at the calibration temperature to a target frequency which is different from an operational target frequency, occurs responsive to adjusting the target frequency;
   in a temperature-correction mode, to correct the measured fine value change to account for a temperature different from the calibration temperature at which its associated coarse value change occurs under the control loop operation with the operational target frequency; and
   in an operational mode, under the control loop operation with the operational target frequency, to override the control loop operation and immediately impose the corrected fine value change on the fine value when its associated coarse value change occurs and then continue with any further control-loop adjustments.

2. The oscillating circuitry according to claim 1, wherein the control circuitry is configured to change the coarse value when the fine value reaches an upper or lower limit value.

3. The oscillating circuitry according to claim wherein the control circuitry is operable:
   in the calibration mode at the calibration temperature, to cause a plurality of coarse value changes to occur by adjusting the target frequency, each coarse value change corresponding at the calibration temperature to a target frequency which is different from the operational target frequency, and to measure, for each of those coarse value changes, an associated fine value change;
   in the temperature-correction mode, to correct each or any of the measured fine value changes to account for a temperature different from the calibration temperature at which its associated coarse value change would be expected to occur under the control loop operation with the operational target frequency; and in the operational mode, when one of the coarse value changes occurs, to impose its associated corrected fine value change on the fine value and then continue with any further control-loop adjustments.

4. The oscillating circuitry according to claim 3, wherein the controllable oscillator is configured so that, at the calibration temperature, the coarse value for the operational target frequency is positioned within an operational range of coarse values relative to the position of the calibration temperature within an operational temperature range of the oscillating circuitry.

5. The oscillating circuitry according to claim wherein the control circuitry is operable, in the calibration mode at the calibration temperature, to measure the or each associated fine value change by:
adjusting the target frequency under the control loop operation and measuring the fine value change which does occur when the associated coarse value change occurs; or
adjusting the coarse value and adjusting the fine value to maintain the output frequency.

6. The oscillating circuitry according to claim 1, wherein:
the control circuitry is operable to enter the temperature-correction mode while in the operational mode so as to perform the correction of any or each said measured fine value change if it is determined that the associated coarse value change will occur; and/or
the control circuitry is operable to enter the temperature-correction mode before entering the operational mode so as to perform the correction of any or each said measured fine value change before the operational mode is entered.

7. The oscillating circuitry according to claim 1, wherein the control circuitry is operable, in the operational mode, when a coarse value change occurs and after imposing the associated corrected fine value change on the fine value, to determine whether any further control-loop adjustments are made associated with that coarse value change before the fine value settles and, if so, to update the associated corrected fine value change to account for such further control-loop adjustments.

8. The oscillating circuitry according to claim 7, wherein the control circuitry is operable, when updating a corrected fine value change, to take account of previous updates to that corrected fine value change.

9. The oscillating circuitry according to claim 1, wherein:
the control circuitry comprises PI-loop filter circuitry configured to generate the fine value, the PI-loop filter circuitry having a P-path being a proportional-gain path and an I-path being an integral-gain path; and
the control circuitry is operable, in the operational mode, when one of the coarse value changes occurs, to impose its associated corrected fine value change on the fine value by applying that corrected fine value change to the I-path of the PI-loop filter circuitry.

10. The oscillating circuitry according to claim 1, wherein the control circuitry is operable, in the calibration mode at the calibration temperature when a said coarse value change occurs, to impose an associated default fine value change on the fine value and then continue with any further control-loop adjustments before measuring the associated fine value change.

11. The oscillating circuitry according to claim 1, wherein the control circuitry is operable, in the temperature-correction mode, to determine an amount by which to correct a said fine value change by reference to temperature-dependence information indicating how the operation of the oscillating circuitry or the controllable oscillator changes with temperature.

12. The oscillating circuitry according to claim wherein the control circuitry is operable:
in the calibration mode at the calibration temperature, to measure for the or each coarse value change an associated frequency change by which the output frequency would change if the fine value is not changed as the coarse value changes; and
in the temperature-correction mode, to determine an amount by which to correct a said fine value change by reference to the or each associated frequency change and temperature-dependence information indicating how that associated frequency change changes with temperature.

13. The oscillating circuitry according to claim being a phase-locked loop.

14. Integrated circuitry, such as an IC chip, comprising the oscillating circuitry according to claim 1.

15. A computer program which, when executed on a computer of oscillating circuitry, causes the computer to carry out a method of controlling the oscillating circuitry, the oscillating circuitry comprising a controllable oscillator operable to generate an output signal having an output frequency dependent on a coarse value and a fine value, the coarse value causing the output frequency to be within an associated band of output frequencies and the fine value controlling the output frequency within that band, the method comprising:
generating the coarse and fine values so as to control the controllable oscillator;
under control loop operation, based on a measurement indicative of a difference between the output frequency and a target frequency, applying control-loop adjustments to the coarse and fine values to tend to maintain the output frequency at the target frequency;
in a calibration mode at a calibration temperature, measuring a fine value change which occurs under the control loop operation when an associated coarse value change, corresponding at the calibration temperature to a target frequency which is different from an operational target frequency, occurs responsive to adjusting the target frequency;
in a temperature-correction mode, correcting the measured fine value change to account for a temperature different from the calibration temperature at which its associated coarse value change occurs under the control loop operation with the operational target frequency; and
in an operational mode, under the control loop operation with the operational target frequency, overriding the control loop operation and immediately imposing the corrected fine value change on the fine value when its associated coarse value change occurs and then continuing with any further control-loop adjustments.

16. The oscillating circuitry according to claim 1, wherein the control circuitry is operable, under the control loop operation and when the control circuitry generates a given coarse value, to progressively increase or decrease the fine values responsive to said measurement.

17. The oscillating circuitry according to claim 1, wherein the control circuitry is operable;
in the calibration mode at the calibration temperature, to store the measured fine value change in accessible memory; and in the temperature-correction mode, to correct the measured fine value change stored in the accessible memory.

\* \* \* \* \*